United States Patent [19]
Messer et al.

[11] Patent Number: 5,096,364
[45] Date of Patent: Mar. 17, 1992

[54] WAFER ARM HANDLER MECHANISM

[75] Inventors: Mark G. Messer, Los Gatos; Lawrence R. Stark, San Jose, both of Calif.

[73] Assignee: Varian Associates, Inc., Palo Alto, Calif.

[21] Appl. No.: 596,119

[22] Filed: Oct. 11, 1990

Related U.S. Application Data

[63] Continuation of Ser. No. 473,123, Jan. 31, 1990, abandoned, which is a continuation of Ser. No. 302,999, Jan. 26, 1989, abandoned, which is a continuation of Ser. No. 53,224, May 22, 1987, abandoned, which is a continuation of Ser. No. 856,750, Apr. 28, 1986, Pat. No. 4,670,126.

[51] Int. Cl.⁵ .............................. B65G 35/00
[52] U.S. Cl. .................... 414/744.5; 414/217; 414/744.6
[58] Field of Search .......... 414/217, 222, 225, 749, 414/744.5, 744.6, 331, 416; 901/21

[56] References Cited

U.S. PATENT DOCUMENTS

| | | | |
|---|---|---|---|
| 3,010,587 | 11/1961 | Hollinger | 414/744.5 |
| 3,240,360 | 3/1966 | Richards | 414/744.5 |
| 3,363,474 | 1/1968 | Ritter et al. | 414/749 X |
| 3,874,525 | 4/1975 | Hassan et al. | 414/225 |
| 4,392,776 | 7/1983 | Shum | 414/744.5 |
| 4,398,863 | 8/1983 | Shum | 414/733 |
| 4,433,951 | 2/1984 | Koch et al. | 414/217 |
| 4,483,654 | 11/1984 | Koch et al. | |
| 4,552,505 | 11/1985 | Gorman | 414/735 |
| 4,584,045 | 4/1986 | Richards | 414/217 X |
| 4,619,575 | 10/1986 | Summa et al. | 414/280 |
| 4,643,627 | 2/1987 | Bednorz et al. | 414/217 |
| 4,659,413 | 4/1987 | Davis et al. | 156/345 |
| 4,682,932 | 7/1987 | Yoshino | 901/21 X |
| 4,687,542 | 8/1987 | Davis et al. | 414/217 X |
| 4,693,666 | 9/1987 | Garin | 414/744.5 |
| 4,695,215 | 9/1987 | Jacoby et al. | 414/225 |
| 4,921,395 | 5/1990 | Sahlir | 414/744.5 |

Primary Examiner—David A. Bucci
Attorney, Agent, or Firm—Gerald M. Fisher; Sheri M. Novack

[57] ABSTRACT

A wafer handler arm conveys a wafer from a horizontal orientation to a vertical orientation for wafer processing. The arm includes a wafer holding member which is rigidly attached to a first shaft. The first shaft is rotatable about its longitudinal axis and the first shaft is rotatable about a second axis perpendicular to the first axis.

5 Claims, 14 Drawing Sheets

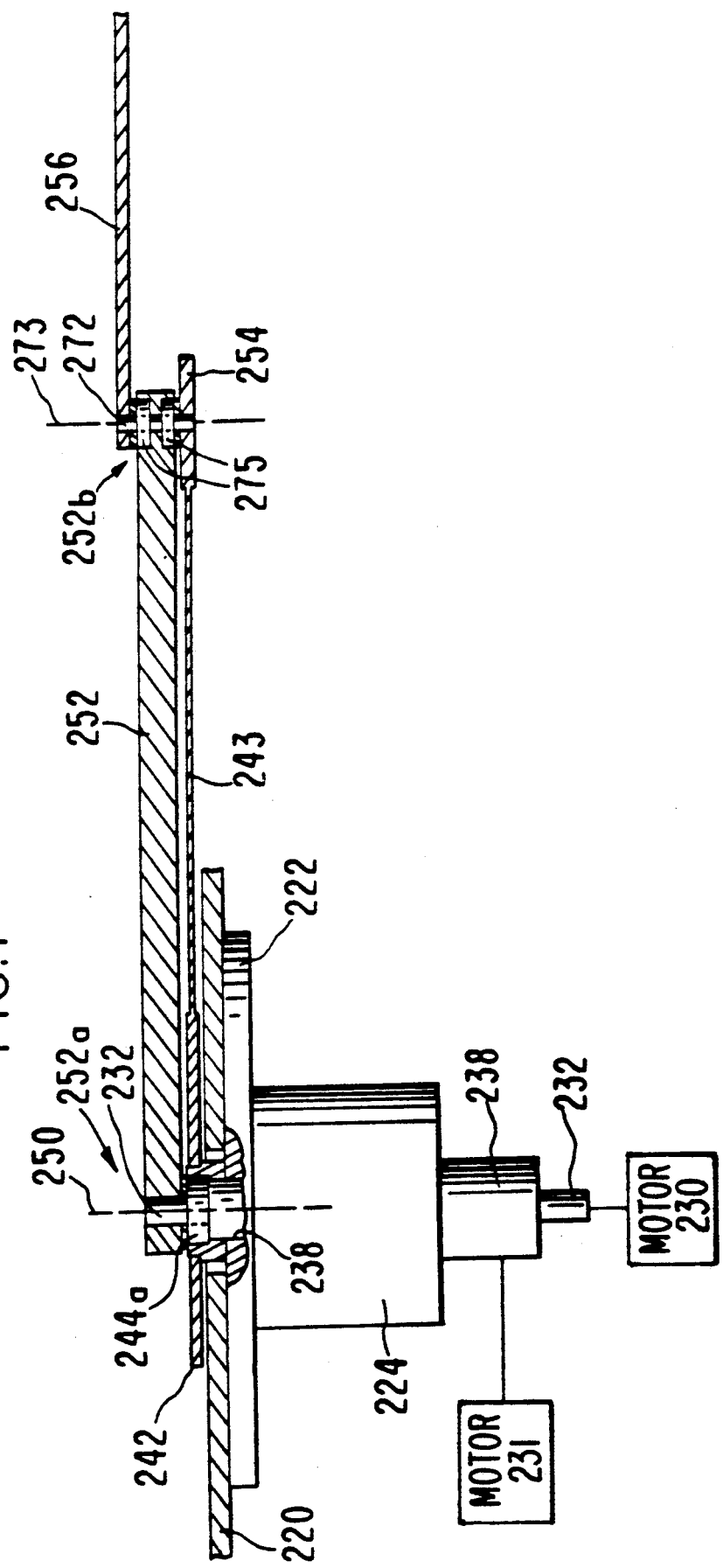

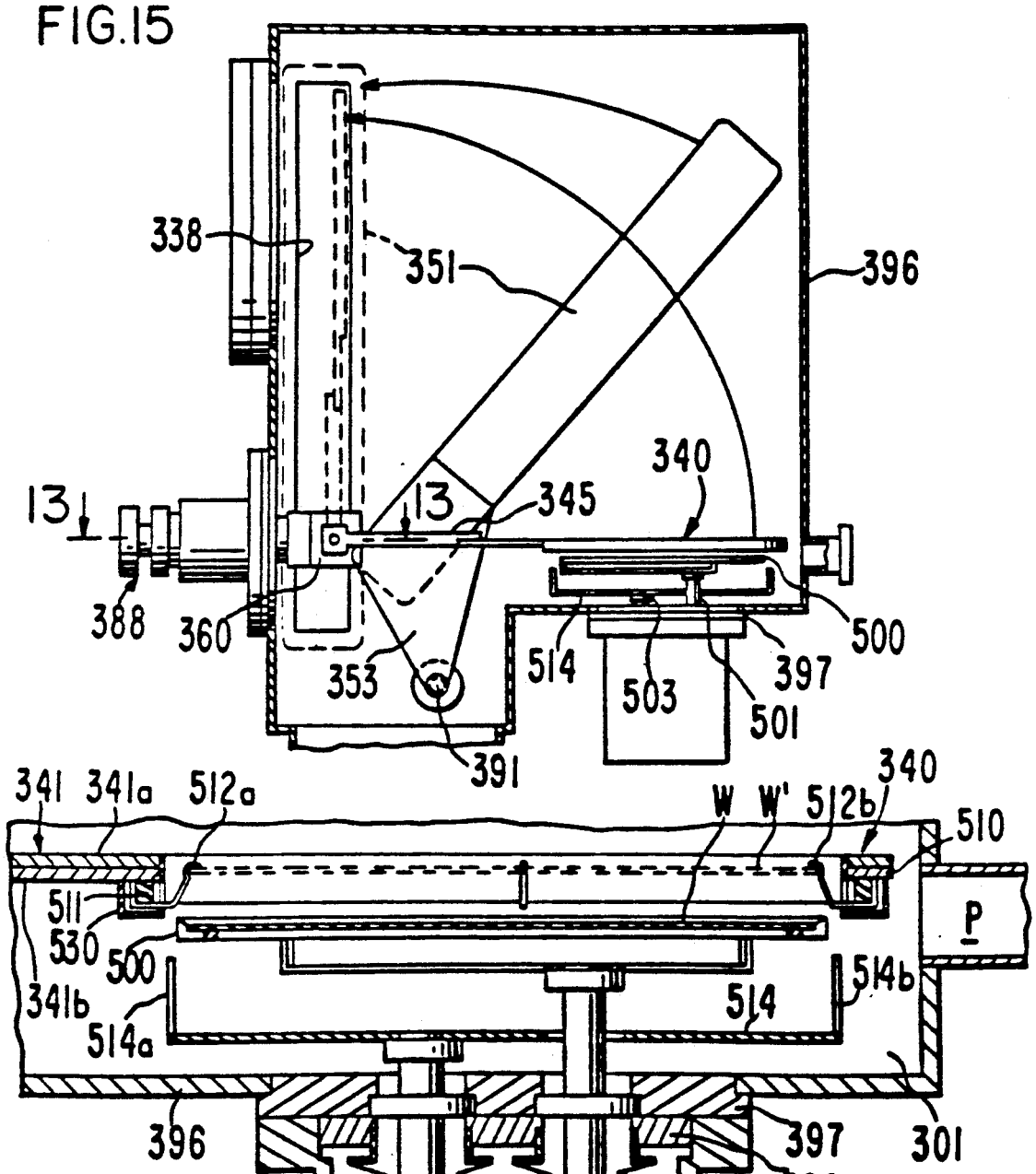
FIG.15
FIG.16
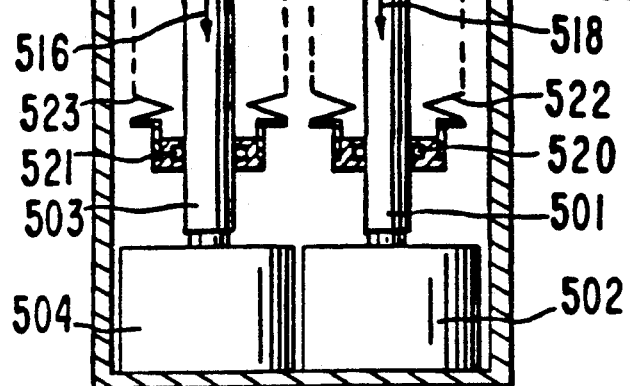

WAFER ARM HANDLER MECHANISM

This application is a continuation of Ser. No. 07/473,123 filed 01-31-90, now abandoned, which is a continuation of Ser. No. 07/302,999 filed 01-26-89, now abandoned, which is a continuation of Ser. No. 07/053,224 filed 05-22-87, now abandoned, which is a continuation of Ser. No. 06/856,750 filed 04-28-86, now U.S. Pat. No. 4,670,126.

FIELD OF THE INVENTION

This invention pertains to a sputter module particularly suited for use in a modular semiconductor wafer processing machine.

BACKGROUND OF THE INVENTION

Sputter processing machines in general have the problem that the machine inherently coats the support apparatus holding the wafer thereby creating mechanical problems at and a source of dust. The support apparatus must therefore be periodically cleaned. In most prior art machines, the entire machine must be exposed to the atmosphere during cleaning thereby creating problems of contaminating the sputter source.

OBJECTS OF THE INVENTION

It is an object of the invention to devise a sputter module suitable for use in a modular semiconductor wafer processing machine in which the sputter source can be isolated in vacuum while cleaning the support apparatus.

SUMMARY OF THE INVENTION

A wafer handling arm mechanism for use in a vacuum which uses a unique pulley arrangement to control relationship between two rigid arms in a manner which reduces to a minimum the introduction of friction released contaminating particles.

These and further constructional and operational characteristics of the invention will be more evident from the detailed description given hereinafter with reference to the figures of the accompanying drawings which illustrate one preferred embodiment and alternatives by way of non-limiting examples.

BRIEF DESCRIPTION OF THE DRAWINGS

FIG. 7 shows a partial sectional view of the arm of FIG. 6.

FIG. 13 is a sectional view of the drive mechanism of the module of FIGS. 11 and 12 along the section line 13—13 as shown in FIG. 15.

FIG. 14 is a sectional view of the drive mechanism of the module of FIG. 11 along the section line 14—14.

FIG. 15 is a sectional view through the module of FIG. 11 along the sectional line 15—15.

FIG. 16 is a cross-sectional view of the mechanism for receiving the wafer from the transport arm along the section line 16—16 shown in FIG. 12.

DETAILED DESCRIPTION OF THE PREFERRED EMBODIMENTS

Figure 1:
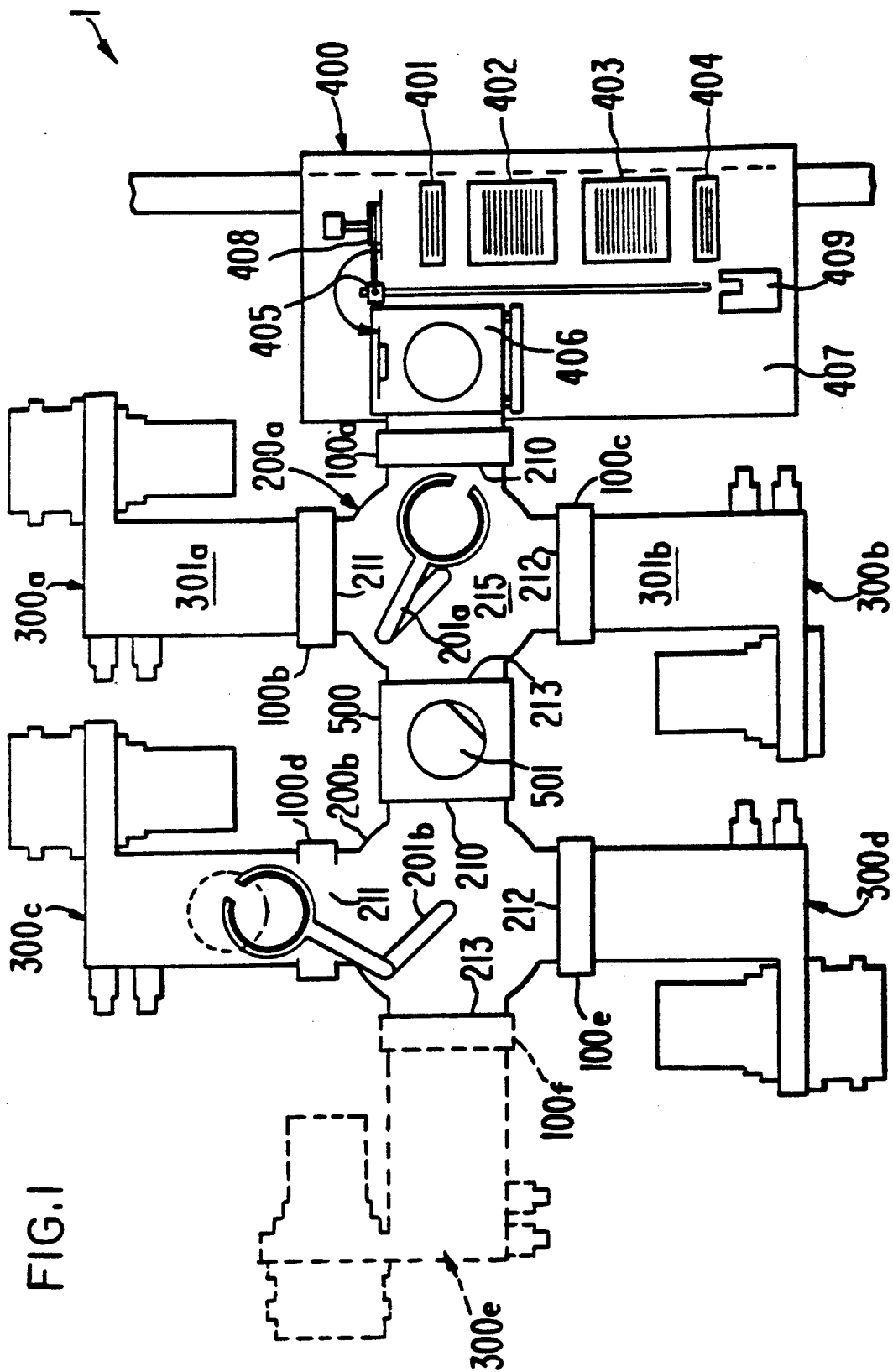
FIG. 1 is a partially schematic plan view of one embodiment of the system according to the invention.

Referring now to the drawings wherein reference numerals are used to designate parts throughout the various figures thereof, there is shown in FIG. 1 a partially schematic plan view of one embodiment of modular semiconductor wafer transport and processing system 1 of the present invention Modular wafer processing system 1 includes wafer handler and loadlock module 400, gate valve modules 100a-100f, transfer modules 200a and 200b, process modules 300a-300d, and pass-through module 500 connected between transfer modules 200a and 200b.

Wafer handler and loadlock module 400 is generally rectangular in plan view and region 407 exterior to loadlock chamber 406 and within the confines of module 400 is at atmospheric pressure. A controlled, low particulate atmosphere environment is provided in this portion of the system. In operation, a selected wafer to be processed is loaded from a selected one of semistandard or equivalent wafer cassettes 402-403 in wafer handler and loadlock module 400 by means of wafer handler which transports the selected wafer from its cassette to wafer aligner and flat finder 408 and from wafer aligner 408 to loadlock chamber 406. Wafers may also be loaded from cassette 404 which is reserved for process qualification wafers. Cassette 401 is a storage cassette allowing wafers to cool after processing before being placed in one of the other cassettes or thin film monitor 409. Wafer cassettes 401-404 are tilted at a small angle relative to the horizontal, for example, 7 degrees, so that the planar surfaces of the wafers in cassettes 401-404 are offset from the vertical by this same small angle so that the wafers are tilted to be in a known direction relative to the wafer retaining slots in the cassette when resting in their cassettes. During the transfer of a selected wafer from its cassette into loadlock chamber 406, the wafer is first moved by wafer handler 405, while maintaining the surface of the wafer in a vertical orientation, to wafer aligner 408. The selected wafer is then rotated so that the planar surfaces of the wafer are horizontal and placed in load lock 406, which is then open to the atmosphere. The planar surfaces of the wafer then remain horizontal during the transport of the wafer through gate valve module 100a into transfer module 200a by transfer arm 201a which extends through entry/exit port 210 of transfer module 200a and gate valve module 100a to withdraw the wafer in loadlock chamber 406.

Transfer module 200a has four ports, 210, 11, 212 and 213. Ports 210, 211 and 212 are controlled by gate valve modules 100a, 100b and 100c, respectively. Port 211 and its corresponding gate valve module 100b connects chamber 215 of transfer module 200a with chamber 301a of process module 300a. Similarly, port 212 and corresponding gate valve module 100c connects chamber 215 of transfer module 200a with chamber 301b of processing module 300b. Interior chamber 215 of transfer module 200a is maintained at a selected pressure less than atmospheric pressure by a conventional pumping mechanism (not shown in FIG. 1). In order to increase the rate at which chamber 215 may be evacuated, chamber 215 is dimensioned relative to arm 201a to minimize the volume of chamber 215.

After unloading the wafer from loadlock chamber 406, transfer arm 201a retracts into transfer chamber 215 and gate valve 100a is closed. Transfer arm 201a then rotates through a selected angle in order to present the wafer to a selected process port 211 or 212, or to transfer port 213. When a selected wafer is presented to a process port, e.g., port 211, the corresponding gate valve module, e.g., module 100b, which is closed during the transfer of the selected wafer from loadlock 406 into chamber 215 of transfer module 200a, is opened by means of a control system (not shown). Arm 201a is then extended through the process port, e.g., port 211, and the corresponding gate valve module, e.g., module 100b, into the corresponding process chamber, e.g., chamber 301a of the corresponding process module, e.g., 300a. The wafer is then off-loaded by means not shown in FIG. 1.

The process modules 301a and 301b may be the same, so that the same operation is performed therein, or these modules may be different with different operations being performed therein. In either case, the provision of two process modules 300a and 300b connected to transfer module 200a via ports 211 and 212 and gate valve modules 100b and 100c, respectively, together with entry/exit port 210 and valve 100a connecting transfer module 200a to wafer handler and loadlock 400 permits non-serial processing of wafers and increased throughputs compared to sequential processing systems. The time required to transfer a wafer from a wafer cassette and off-load the wafer in a selected process module is typically much less than the time required for the processing of the wafer within the process module. Thus, when a first wafer has been transferred from an input cassette into a selected one of process modules 300a and 300b, during the initial period of processing in process chamber 300a, a second wafer may be transported from loadlock chamber 406 to process module 300b. Transfer arm 201a may then rotate back to port 211 to await the completion of processing of the wafer in process module 300a. Thus, during a substantial portion of the time processing is occurring simultaneously in process modules 300a and 300b. If desired, process module 300b may be a pre-process module for sputter etch cleaning, or for deposition of a metal film by a process other than sputtering, for example chemical vapor deposition, when the main process stations are employed for sputter deposition. The wafers may then be processed in the remaining process chambers in system 1.

The provision of the second entry/exit port 213 in transfer module 200a permits connection to additional process modules 300c and 300d. Transfer module 200a is connected to an identical transfer module 200b (corresponding parts bear the same numerals) via passthrough module 500. Pass-through module 500 connects entry/exit port 213 of transfer module 200a with entry/exit port 210 of transfer module 200b, thus forming a single vacuum chamber. When it is desired to transfer a wafer carried by arm 201a to one of process chambers 300c and 300d, the wafer is offloaded to a flat aligner 501 in pass-through module 500. The wafer is then on-loaded to arm 201b of transfer module 200b and transferred into the selected one of process modules 300c through 300e by arm 201b via corresponding gate valve modules 100d through 100f. When a wafer has been completely processed, it is returned from the processing module in which it resides to loadlock chamber 406 and thence to a selected cassette (401–404) via transfer arm 201a or via transfer arm 201b, pass-through chamber 500 and transfer arm 201a. Process module 300e is drawn with dashed lines to indicate that it is optional and to illustrate the capability of adding modules at will.

The system shown in FIG. 1 may be expanded linearly by replacing gate valve 100f and process module 300e by a pass-through module, identical to pass-through module 500, connecting transfer module 200b with a transfer module (not shown) identical to transfer module 200b, which is in turn connected to a corresponding plurality of process chambers. The system shown in FIG. 1 may also be expanded in a non-linear fashion by replacing process module 300d by a passthrough module, identical to pass-through module 500, connecting transfer module 200b with a transfer module (not shown) identical to transfer module 200b which is connected to a corresponding plurality of process chambers. If desired, optional process module 300e may also be replaced by a second wafer handler and loadlock module identical to wafer handler and loadlock module 400.

The configuration of the processing system shown in FIG. 1 permits non-serial processing, i.e., any wafer entering loadlock 406 may be transferred to a selected process chamber without passing through any other process chamber and any wafer may be transferred from a selected process chamber to any other selected process chamber or to loadlock chamber 406 without passing through any intermediate process chamber. The operation of the transfer arms, gate valves, flat aligners and loadlock chamber in system 1 are controlled by a master controller circuit (not shown). The master controller circuit is typically operated so that the gate valves are sequenced so that no given process chamber is in direct communication with another process chamber. Thus the system provides complete dynamic isolation.

The non-serial processing afforded by system 1 permits continued operation of the remaining process modules when a particular process module is inoperative. The non-serial processing also permits the performance of a replacement process module or of any designated process module to be checked while the remainder of the system continues to operate. For example, if it is desired to check the performance of module 300c, a monitor wafer stored in cassette 404 may be transferred into process chamber 300c, processed and returned to cassette 404. During the processing in chamber 300c, the remainder of system 1 continues to process production wafers.

Figure 2:
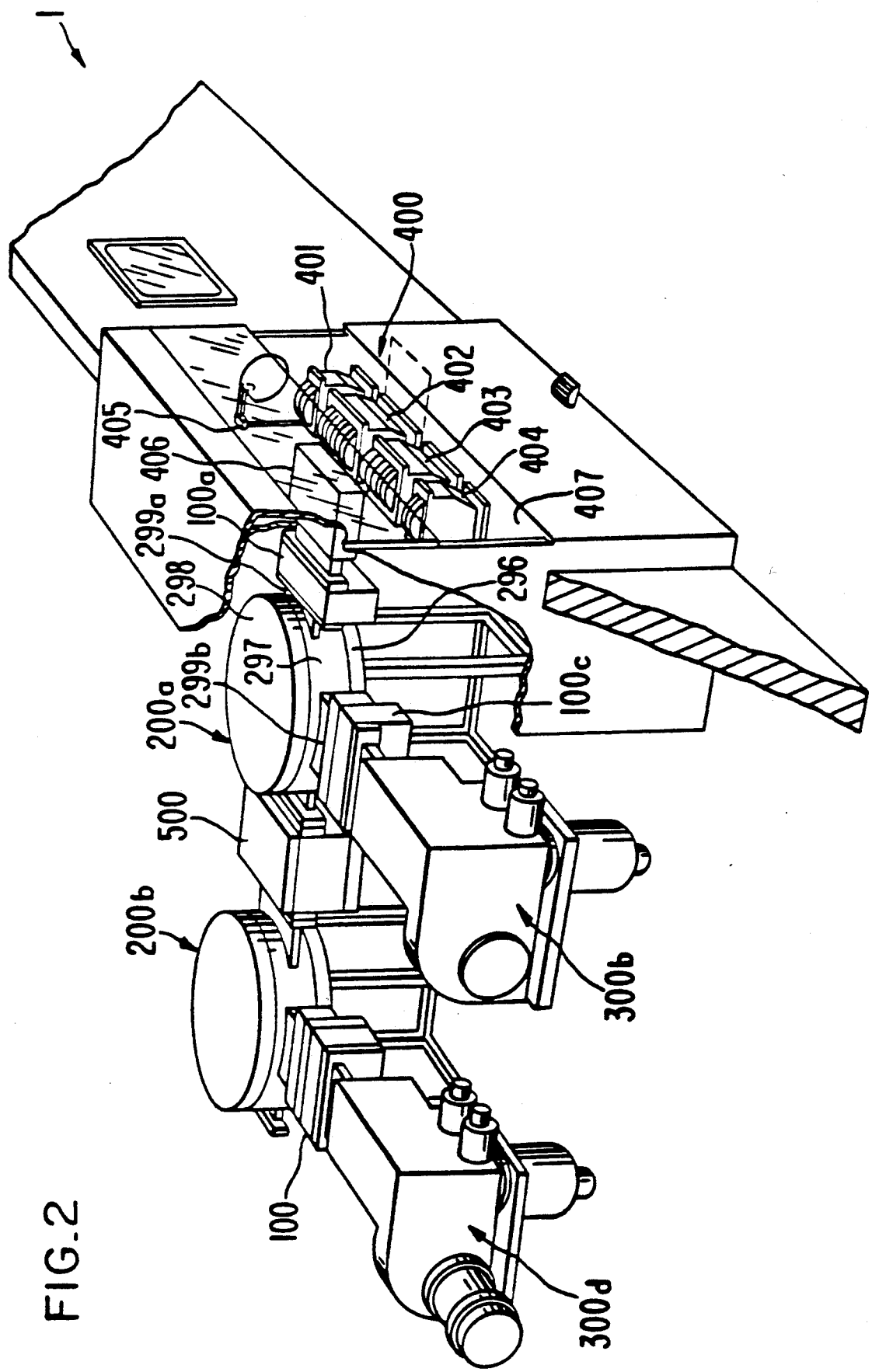
FIG. 2 shows a partial perspective view of the system shown in FIG. 1.

FIG. 2 shows a partial perspective view of the semiconductor wafer transport and processing system shown in FIG. 1. In particular the housing of transfer module 200a is generally cylindrical in shape, and includes circular top 298, circular bottom 296 and cylindrical wall 297, joining top 298 and bottom 296. The housing may be made of any suitable vacuum compatible material, for example, stainless steel.

The ports of each transfer chamber are defined by extensions of the housing which form horizontal slots extending from interior chamber 215 to the exterior of the housing. For example, port 210 (FIG. 1) is defined by housing extension 299a, shown in FIG. 2.

Figure 3:
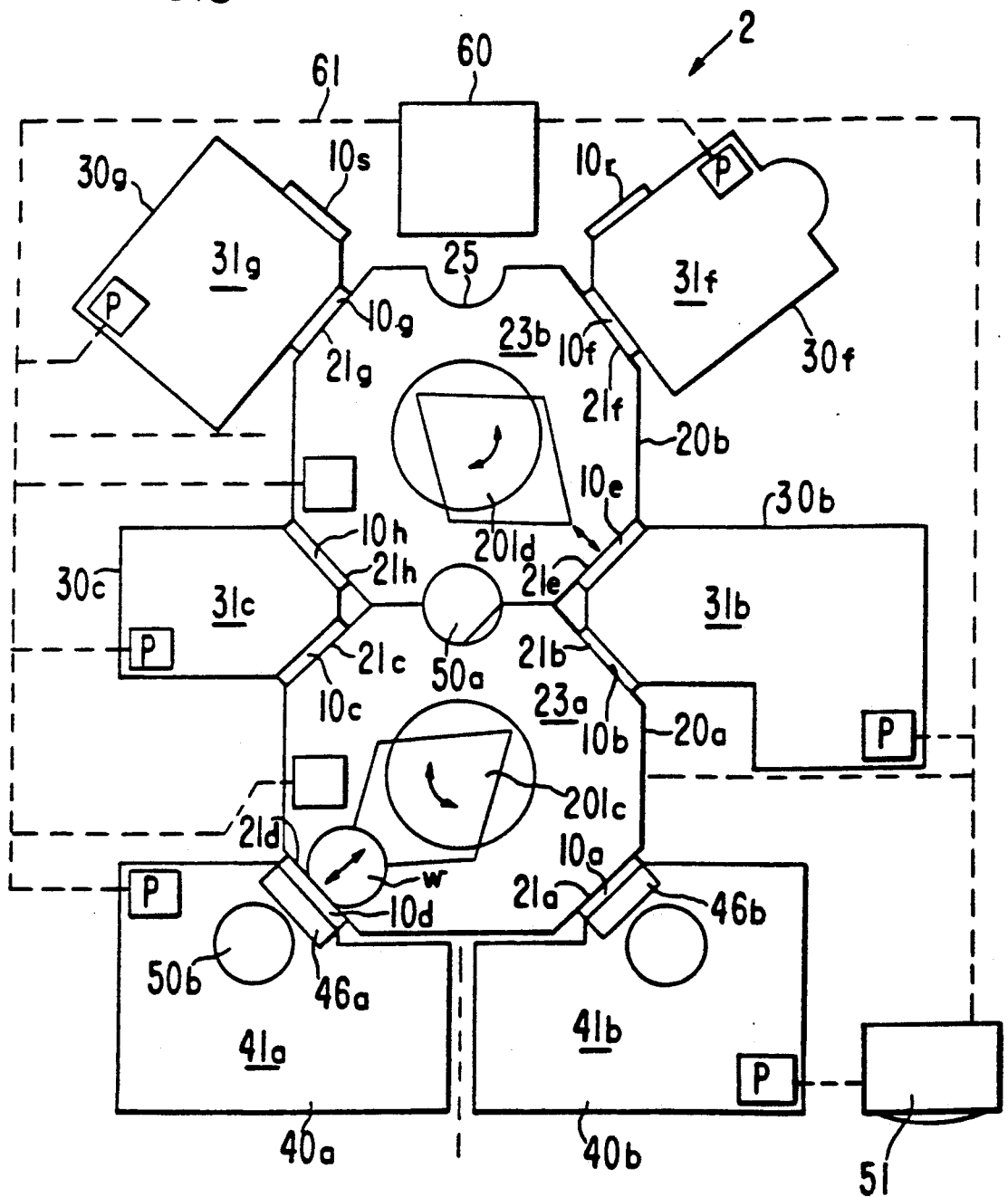
FIG. 3 shows a partially schematic plan view of a second embodiment of the system according to the invention.

FIG. 3 shows a partially schematic plan view of a second embodiment of the wafer transport and processing system of the present invention. Wafer transport and processing system 2 includes entry wafer handler and loadlock module 40a, exit wafer handler and loadlock module 40b, transfer modules 20a and 20b, gate valve modules 10a–10h, and process chambers 30b, 30c, 30f and 30g. Wafer handler and loadlock module 40a is the same as wafer handler and loadlock module 400 shown in FIG. 1. Transfer module 20a includes a vacuum chamber having ports 21a–21d for communicating the interior 23a of transfer module 20a with the exterior of module 20a. Ports 21a–21d are opened and closed by gate valve modules 10a–10d. Transfer module 20a is connected to an identical transfer module 20b via flat aligner 50a, thus forming a single vacuum chamber which is evacuated by conventional pumping means not shown in FIG. 3. Flat aligner 50a may be replaced by any suitable means for positioning a wafer in a desired rotational orientation. Transfer module 23b has four ports, 21e–21h, which are opened and closed by gate valve modules 10e–10h, respectively. The interior 31c of reactive ion etch module 30c is connected to interior chamber 23a of transfer module 20a and to interior chamber 23b of transfer module 20b via ports 21c and 21h, respectively, which are controlled by gate valve modules 10c and 10h, respectively. Similarly, the interior chamber 31b of sputter module 30b communicates with interior chambers 23a and 23b of transfer modules 20a and 20b via ports 21b and 21e, respectively, which are controlled by gate valve modules 10b and 10e, respectively. Port 21g, controlled by gate valve module 10g, connects interior chamber 23b of transfer module 20b with interior chamber 31g of chemical vapor deposition module 30g. Port 21f, controlled by gate valve module 10f, communicates interior chamber 23b of transfer module 20b with interior chamber 31f of rapid anneal module 30f.

Master controller 60 communicates with each process chamber controller P and with entry module 40a and exit module 40b and operator control panel via standard communication bus 61.

In operation, a selected wafer is transported by a wafer handler (not shown in FIG. 3.) from a selected wafer cassette (not shown in FIG. 3) in entry module 40a to flat finder 50b and thence to loadlock chamber 46a, which is the same as loadlock chamber 406 shown in FIG. 1. Transfer arm 201c of transfer module 20a extends into loadlock chamber 46a via port 21d which is opened and closed by gate valve module 10d. The selected wafer is then on-loaded to transport arm 201c which then retracts into interior chamber 23a of transfer module 20a. Arm 201c then rotates through a selected angle to present the selected wafer to port 21c or 21b or to flat finder 50a. A wafer transferred to flat finder 50a may be on-loaded onto either transport arm 201d or onto transport arm 201c. Wafers on-loaded from flat finder 50a to transport arm 201d are then retracted by transport arm 201d into chamber 23b rotated through a suitable angle and presented to a selected port 21g or 21f. The gate valve module controlling the selected port then opens the port and transport arm 201d extends into the interior chamber of the selected process module where it is off-loaded by means not shown in FIG. 3. When flat orientation is not required for a wafer or circularly symmetric substrate, the wafer or substrate can be transferred from transport arm 201c into process chamber 31c or process chamber 31b via gate valves 10c and 10b, respectively, and from there, via gate valves 10h and 10e, respectively, directly to transport arm 201d, bypassing flat finder 50a. When a wafer has been completely processed, the wafer is on-loaded to the transport arm servicing the process module in which the wafer is located, and transferred back to exit port 21a. For a wafer in process module 30b or 30c, this is accomplished through the retraction of transport arm 201c from the process chamber, followed by a suitable rotation of transport arm 201c, which is then extended through port 21a, which is controlled by gate valve module 10a, into loadlock chamber 46b. For a wafer in process module 30g or 30f, the wafer is first transferred to transport arm 201d and from arm 201d to arm 201c via flat finder 50a.

Semicircular arc 25 denotes that the system shown in FIG. 3 may be expanded by adjoining a third transfer module similar to transfer module 20b to a flat finder located at semicircular arc 25.

The modules shown in the embodiment of FIG. 3 are interchangeable, allowing the system to be configured with any combination of modules that may be desired.

The system shown in FIG. 3 has the same advantage of non-serial processing as the system shown in FIG. 1. The system shown in FIG. 3 is somewhat more flexible in that transport arm 201d services four processing ports and transfer arm 201c services two processing ports and both an entry and exit module. If desired, entry module 41a may serve as both an entry and exit module and exit module 41b may be replaced by a process module. Similarly, if desired, any process module may be replaced by an exit module or by an entry module.

Figure 4:
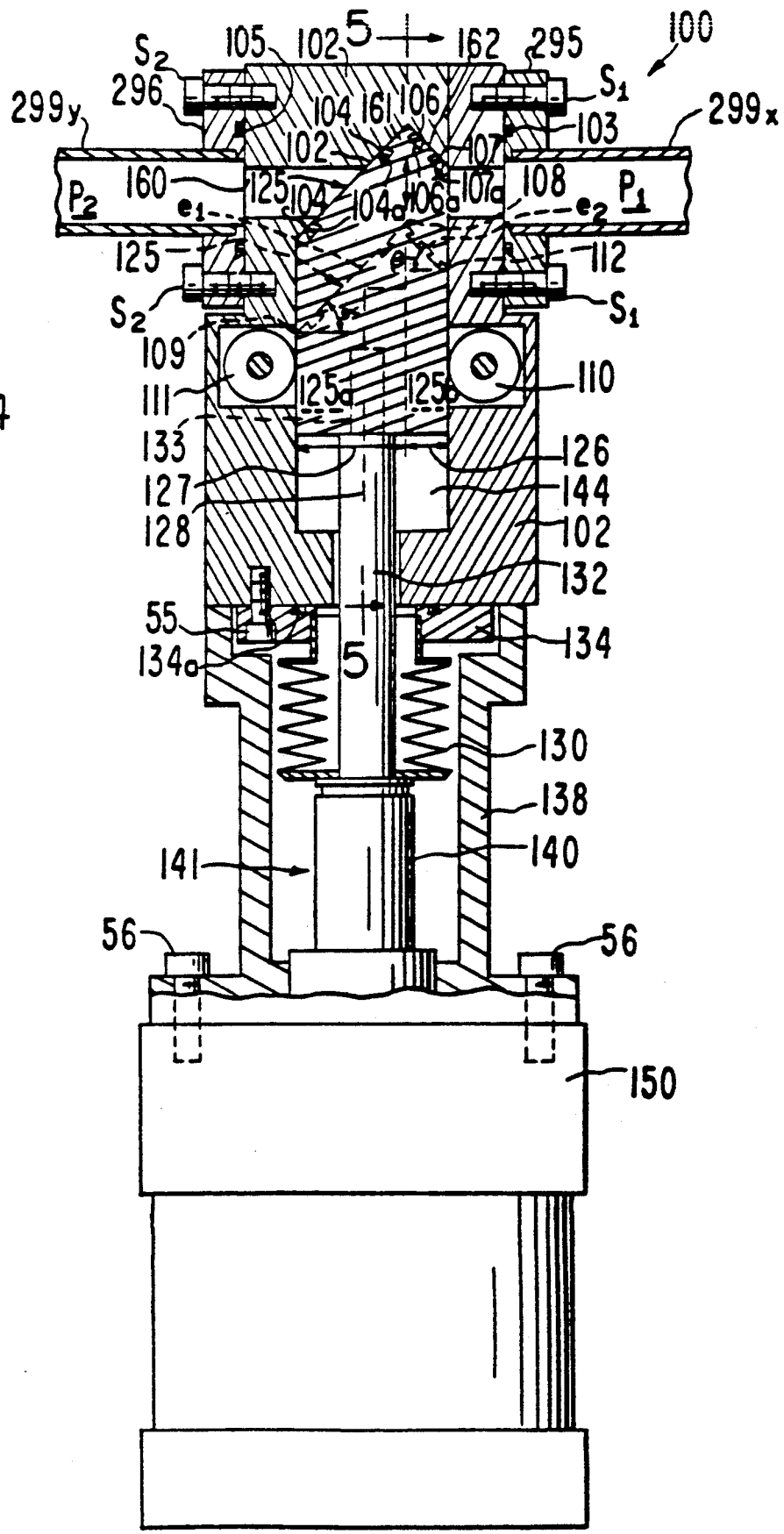
FIG. 4 shows a partially cutaway side view of the gate valve module according to the invention.
Figure 5:
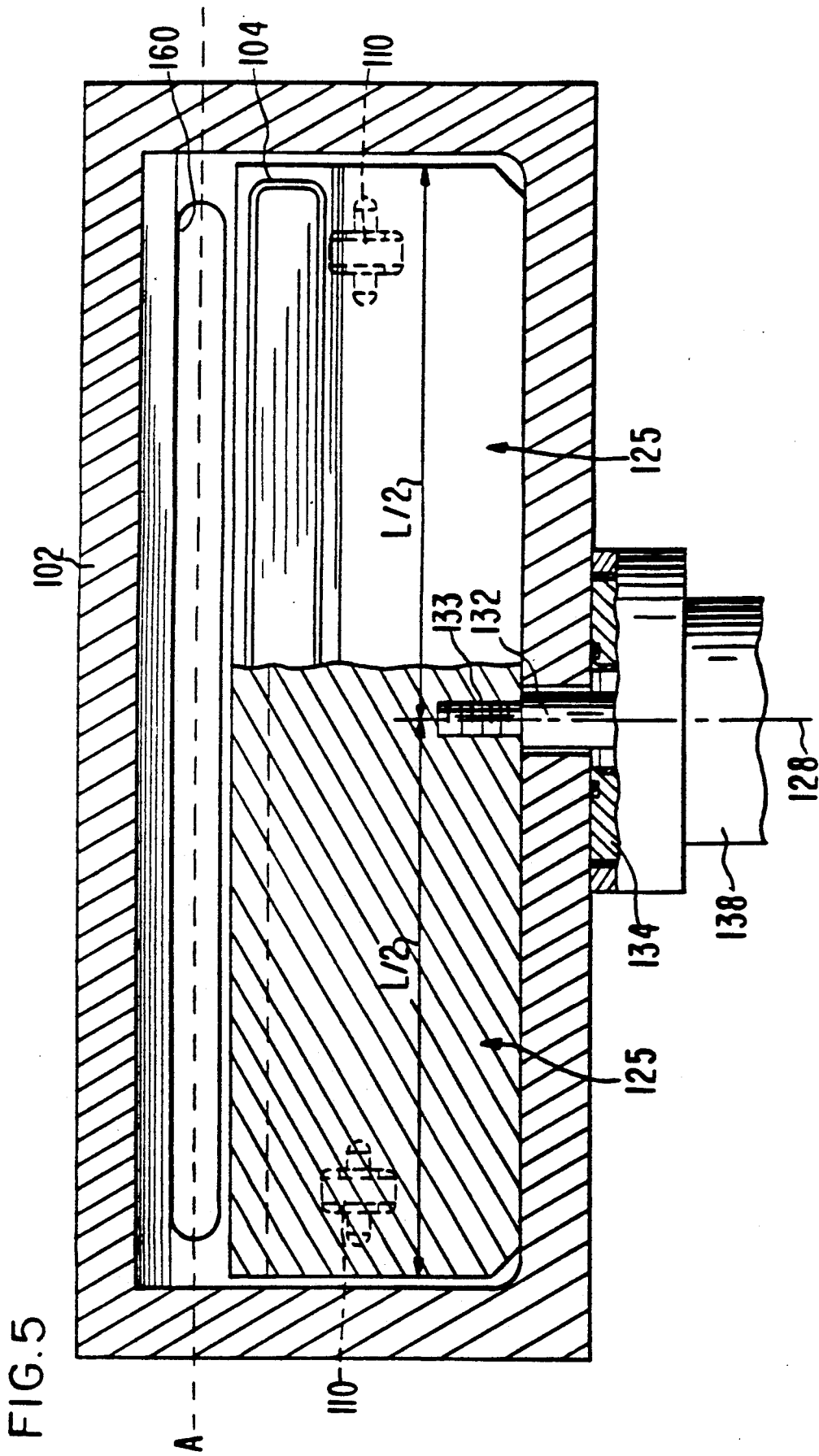
FIG. 5 shows a partially cutaway top view of the gate valve module of FIG. 4.

FIGS. 4 and 5 show a partially schematic cross section and a partial cutaway cross section, respectively, of one embodiment of gate valve module 100. Gate valve module 100 controls the passage between port $P_1$ and port $P_2$. Port $P_1$ is defined by extension 299x of the housing of a first chamber which is either a process chamber, a transfer chamber or a loadlock chamber, which extension forms a generally rectangular slot dimensioned to accommodate the extension therethrough of wafer transport arm shown in FIG. 6. Such an extension (299a) of housing of transfer module 200a is shown in perspective view in FIG. 2. Port $P_2$ is similarly defined by extension 299y of the housing of a second chamber (not shown in FIG. 4).

Housing extensions 299x and 299y defining ports $P_1$ and $P_2$ are attached to valve body 102 by means of a first plurality of screws $S_1$ and a second plurality of screws $S_2$ driven through flanges 295 and 296 respectively. Valve body 102 may be made of stainless steel or other suitable material. Elastomeric O-rings 103 and 105 between flanges 295 and 296 respectively and body 102 provide a vacuum seal. Valve body 102 has a horizontal slot 160 which extends from port $P_1$ to port $P_2$ when valve gate 125 is lowered to the phantom position shown by the dashed lines in FIG. 4. Slot 160 is shown in side view in FIG. 5 and is dimensioned to accommodate the extension of wafer transport arm 201 shown in FIG. 6 from port $P_1$ to port $P_2$. The dashed line A in FIG. 5 denotes the central plane of slot 160. When valve gate 125 is in its fully retracted position it does not extend into slot 160. This position is denoted by the dashed line in FIG. 4. When gate 125 is in its fully extended position, elastomeric O-ring 104, which is seated in notch 104a, forms a vacuum seal between port $P_1$ and port $P_2$. Elastomeric strips 106 and 107 seated in notches 106a and 107a, respectively, do not perform a vacuum sealing function. Rather, when valve gate 125 is in its fully extended position, strips 106 and 107 provide contact between body 102 and gate 125 so that a rotational moment is produced on gate 125 which opposes the rotational moment on gate 125 produced by the contact between elastomeric O-ring 104, body 102 and valve gate 125. In cross-section, valve gate 125 is a union of two trapezoids 125a and 125b. Edge $e_1$ of trapezoid 125a extends from point 109 to point 108 forming an acute angle alpha of approximately 45° with the horizontal. A substantially larger angle is not desirable since it would then be difficult for elastomeric O-ring 104 to sealingly engage body 102 when valve gate 125 is fully extended. Edge $e_2$ of trapezoid 125b forms an angle beta with the horizontal. In the embodiment shown in FIG. 4 the angle alpha equals the angle beta but this is not critical.

A novel feature of gate valve module 100 is the asymmetry of the cross section of valve gate 125. Since only O-ring 104 provides a vacuum sealing function, trapezoid 125b is made substantially narrower than trapezoid 125a; i.e., the length of line segment 126 is less than the length of line segment 127. In one embodiment, the difference in length between line segment 126 and line segment 127 is approximately one inch. Thus the distance between port $P_1$ and port $P_2$ is substantially reduced compared to prior art valve modules which employ two O-rings and wherein trapezoid 125b is congruent to trapezoid 125a.

Bearings 110 and 111 serve to guide valve gate 125 as it translates vertically in slot 144 of body 102. Valve gate 125 is mounted on shaft 132 which is screwed into valve gate 125 by threaded extension 133 of shaft 132. Valve body 102 is mounted to housing 138 by screws (not shown). Metal bellows 130 is mounted by flange 134 to body 102 by screws 55. Stainless steel shaft 140 has a greater diameter than stainless steel shaft 132. Elastomeric O-ring 134a between flange 134 and valve gate body 102 provides a vacuum seal between the chambers (not shown) connected to ports $P_1$ and $P_2$ and the atmosphere exterior to valve module 100. Shaft 132 is coaxial with and rigidly mounted on shaft 140. Shaft 140 translates vertically in cylindrical cavity 141 formed by housing 138 thus causing valve gate 125 to translate vertically in slot 144. As shown in FIG. 5, shaft 132 is positioned so that longitudinal axis 128 of shaft 132 is located at the lengthwise midpoint of valve gate 125 having length L. Shaft 132 is also positioned so that the sum of the moments about the axis perpendicular to the plane of the cross-section shown in FIG. 4 and passing through axis 128 and the lower surface of valve body 125 is zero. These moments are caused by the forces acting upon O-ring 104 and elastomeric strips 106 and 107 when valve body 102 is fully extended. Housing 138 is mounted on air cylinder 150 by means of screws 56. Shaft 140 is translated vertically by a conventional air-driven piston mechanism 150.

Figure 6:
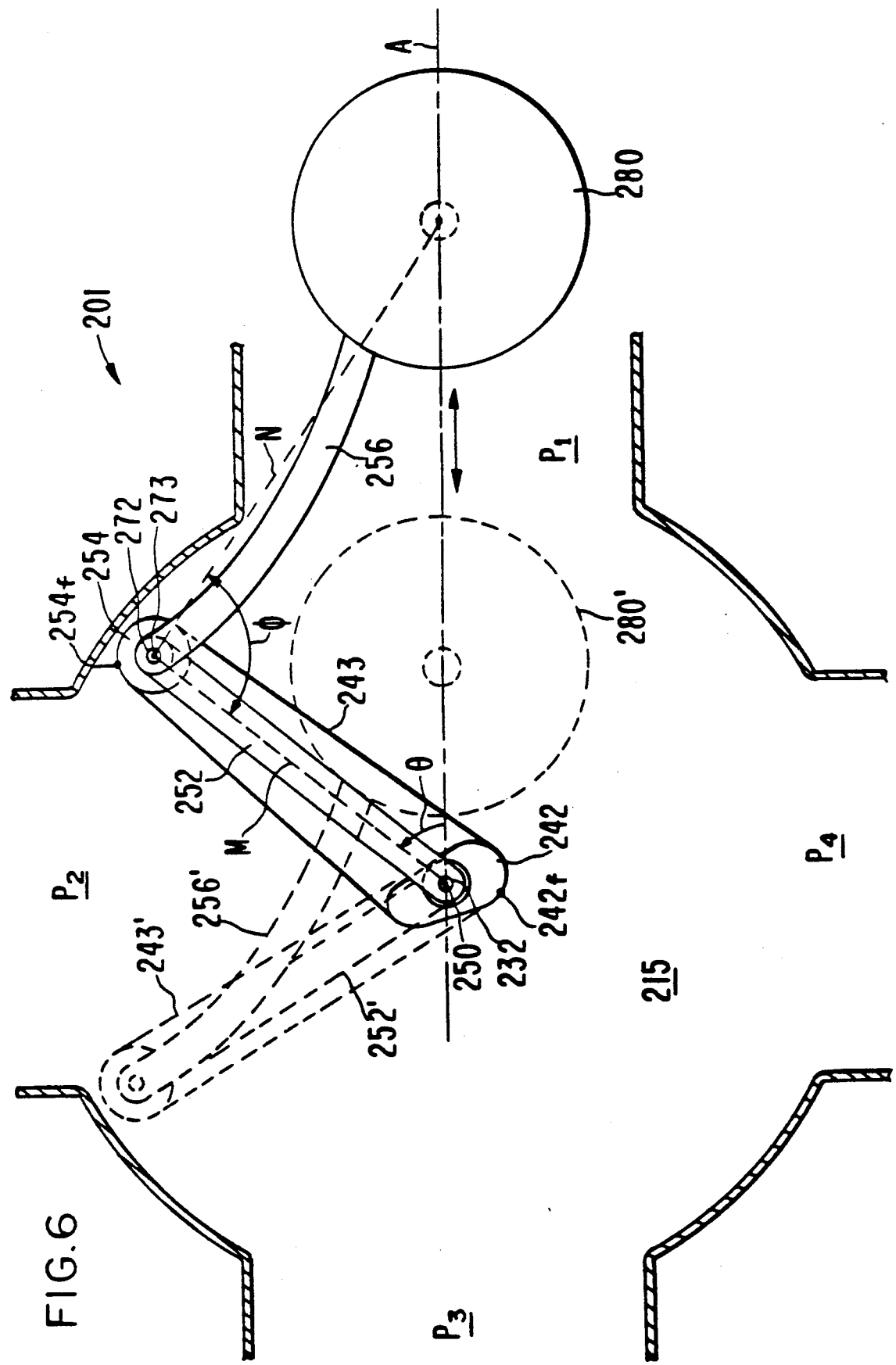
FIG. 6 shows a schematic top view of the wafer transport arm according to the invention with the arm shown also in phantom in a second position.

FIG. 6 shows a plan view and FIG. 7 shows a partially cut-away side view of wafer transport arm mechanism 201. Arm mechanism 201 is one embodiment of transfer arm 201a employed in transfer module 200a of FIG. 1 or of arm 201 in module 20 in FIG. 3. Arm mechanism 201 includes cam 242, a first rigid arm 252, pulley 254, second rigid arm 256 and wafer holder 280.

Wafer holder 280, shown schematically in FIG. 6, is fixedly mounted on one end of arm 256. The other end of arm 256 is rotatably mounted to one end of arm 252 by means of shaft 272. Shaft 272, which passes through one end (252b) of arm 252, has one end fixedly attached to arm 256 and the other end fixedly attached to the center of pulley 254. Shaft 272 rotates about axis 273 against bearings 275, as shown in FIG. 7. Thus, arm 256 rotates with pulley 254. The other end (252a) of arm 252 is fixedly mounted on shaft 232 which is the inner shaft of dual shaft coaxial feedthrough 224 (FIG. 7). Vacuum feedthrough 224, for example a ferrofluidic feedthrough, provides a vacuum seal between the interior of housing 220 of wafer arm mechanism 201 and the exterior of housing 220. Vacuum feedthrough 224 is attached to housing 220 by means of flange 222. Such a ferrofluidic feedthrough is well known in the art; for example, a ferrofluidic feedthrough made by Ferrofluidic, Inc., may be used to implement the drive mechanism described herein. Outer shaft 238 of ferrofluidic feedthrough 224 is fixedly attached to cam 242. Both inner shaft 232 and outer shaft 238 are independently rotatable about the longitudinal axis 250 of shaft 232 and shaft 238 by means of a pair of motors 230 and 231, respectively. Axis 250 is perpendicular to the floor of and passes through the center of vacuum chamber 215 containing arm 201.

Belt 243 is in contact with a portion of the perimeter of cam 242 and a portion of the perimeter of pulley 254. Belt 243 is fixed to cam 242 at point 242f on the perimeter of cam 242 and to pulley 254 at point 254f on the perimeter of the pulley. Belt 243 can be, for example, a stainless steel non-toothed belt or a metal cable.

FIG. 6 shows transport arm mechanism 201 fully extended through port $P_1$. In this embodiment, when arm 201 is fully extended through port $P_1$, the angle $\theta$ between axis M, the midline of arm 252 passing through axis 250 and axis 273, and the midline A of port $P_1$ which passes through axis 250, is approximately 30°. In other embodiments, other angles may be selected in place of 30°. In operation, arm 201 is retracted through port $P_1$ by a counterclockwise rotation of arm 252 about axis 250 while holding cam 242 fixed. This is accomplished by rotating inner shaft 232 of ferrofluidic feedthrough 224 while outer shaft 238 remains fixed. Cam 242 is shaped so that as arm 252 rotates in a counterclockwise direction, stainless steel cable 243 wraps and unwraps around cam 242 thereby rotating pulley 254 so that wafer holder 280 moves in a generally linear path along midline A from its fully extended position to a retracted position inside vacuum chamber 215 as shown by phantom position 280'.

Once wafer transfer arm 201 has been retracted inside chamber 215, both arm 252 and cam 242 are rotated through a selected angle by rotating both inner shaft 232 and outer shaft 238, respectively, through the same selected angles so that arm mechanism 201 is properly positioned to be extended through a second selected port. The ports $P_1$ through $P_4$ shown in FIG. 6 are 90° apart, so that for this embodiment shafts 232 and 238 are rotated through a multiple of 90° to position wafer transport arm 201 for an extension through another port. The extension is accomplished by rotating arm 252 about the axis of shaft 232 in a clockwise direction with respect to cam 242.

Of importance, as stainless steel cable 243 wraps and unwraps from cam 242 as wafer transport arm 201 is extended or retracted through a selected port, there is no sliding or rolling friction between cam 242 and cable 243. Thus, this design is particularly suitable for maintaining a clean environment within vacuum chamber 215.

Cam 242 must be specially shaped in order to ensure that wafer holder 280 retracts (and extends) in an approximately linear manner along axis A. If the motion is to be linear, elementary plane geometry establishes that the angle $\theta$ between port axis A and axis M and the angle phi between arm axis N connecting the center of wafer holder 280 and passing through axis 273 in the plane of FIG. 6 are related by the formula:

$$\text{phi} = 90° - \theta + \cos^{-1}[(d/f)\sin\theta]$$

where d is the length of arm 252 from axis 250 to axis 273 and f is the length of axis N from axis 273 to the center of wafer holder 280.

Table I shows a printout of $\theta$, phi, the difference (decrement) delta phi in the angle phi for constant increments in the angle $\theta$ of 3°, the ratio of the decrement in phi divided by the corresponding increment in $\theta$, the x,y coordinates of axis 273, and the stroke (the x coordinate of the center of wafer handler 280, for the case where d = 10 inches and f = 14 inches).

TABLE I

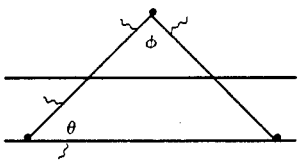

| X | Y | THETA | PHI | DIFF | RATIO | STROKE |
|---|---|---|---|---|---|---|
| 10.00 | 0.00 | 0.00 | 180.00 | | | 24.00 |
| 9.99 | 0.52 | 3.00 | 174.86 | 5.14 | 1.71 | 23.98 |
| 9.95 | 1.05 | 6.00 | 169.72 | 5.14 | 1.71 | 23.91 |
| 9.88 | 1.56 | 9.00 | 164.58 | 5.13 | 1.71 | 23.79 |
| 9.78 | 2.08 | 12.00 | 159.46 | 5.12 | 1.71 | 23.63 |
| 9.66 | 2.59 | 15.00 | 154.35 | 5.11 | 1.70 | 23.42 |
| 9.51 | 3.09 | 18.00 | 149.25 | 5.10 | 1.70 | 23.17 |
| 9.34 | 3.58 | 21.00 | 144.17 | 5.08 | 1.69 | 22.87 |
| 9.14 | 4.07 | 24.00 | 139.11 | 5.06 | 1.69 | 22.53 |
| 8.91 | 4.54 | 27.00 | 134.08 | 5.03 | 1.68 | 22.15 |
| 8.66 | 5.00 | 30.00 | 129.08 | 5.00 | 1.67 | 21.74 |
| 8.39 | 5.45 | 33.00 | 124.11 | 4.97 | 1.66 | 21.28 |
| 8.09 | 5.88 | 36.00 | 119.17 | 4.93 | 1.64 | 20.80 |
| 7.77 | 6.29 | 39.00 | 114.29 | 4.89 | 1.63 | 20.28 |
| 7.43 | 6.69 | 42.00 | 109.45 | 4.84 | 1.61 | 19.73 |
| 7.07 | 7.07 | 45.00 | 104.66 | 4.78 | 1.59 | 19.15 |
| 6.69 | 7.43 | 48.00 | 99.94 | 4.72 | 1.57 | 18.56 |
| 6.29 | 7.77 | 51.00 | 95.28 | 4.66 | 1.55 | 17.94 |
| 5.88 | 8.09 | 54.00 | 90.70 | 4.58 | 1.53 | 17.30 |
| 5.45 | 8.39 | 57.00 | 86.21 | 4.49 | 1.50 | 16.66 |
| 5.00 | 8.66 | 60.00 | 81.80 | 4.41 | 1.47 | 16.00 |
| 4.54 | 8.91 | 63.00 | 77.49 | 4.31 | 1.44 | 15.34 |
| 4.07 | 9.14 | 66.00 | 73.28 | 4.21 | 1.40 | 14.68 |
| 3.58 | 9.34 | 69.00 | 69.19 | 4.09 | 1.36 | 14.02 |
| 3.09 | 9.51 | 72.00 | 65.22 | 3.97 | 1.32 | 13.37 |

TABLE I-continued

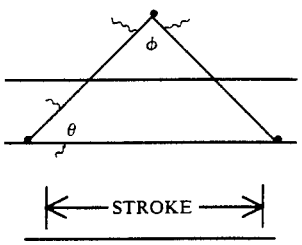

| X | Y | THETA | PHI | DIFF | RATIO | STROKE |
|---|---|---|---|---|---|---|
| 2.59 | 9.66 | 75.00 | 61.39 | 3.84 | 1.28 | 12.72 |
| 2.08 | 9.78 | 78.00 | 57.69 | 3.70 | 1.23 | 12.10 |
| 1.57 | 9.88 | 81.00 | 54.14 | 3.55 | 1.18 | 11.49 |
| 1.05 | 9.95 | 84.00 | 50.75 | 3.40 | 1.13 | 10.90 |
| 0.52 | 9.99 | 87.00 | 47.51 | 3.24 | 1.08 | 10.34 |
| 0.00 | 10.00 | 90.00 | 44.43 | 3.08 | 1.03 | 9.80 |
| −0.52 | 9.99 | 93.00 | 41.50 | 2.92 | 0.97 | 9.29 |
| −1.04 | 9.95 | 96.00 | 35.74 | 2.76 | 0.92 | 8.81 |
| −1.56 | 9.88 | 99.00 | 36.14 | 2.60 | 0.87 | 8.36 |
| −2.08 | 9.78 | 102.00 | 33.69 | 2.45 | 0.82 | 7.94 |
| −2.59 | 9.66 | 105.00 | 31.38 | 2.31 | 0.77 | 7.55 |
| −3.09 | 9.51 | 108.00 | 29.22 | 2.17 | 0.72 | 7.18 |
| −3.58 | 9.34 | 111.00 | 27.18 | 2.03 | 0.68 | 6.85 |
| −4.07 | 9.14 | 114.00 | 25.27 | 1.91 | 0.64 | 6.54 |
| −4.54 | 8.91 | 117.00 | 23.48 | 1.79 | 0.60 | 6.26 |
| −5.00 | 8.66 | 120.00 | 21.79 | 1.69 | 0.56 | 6.00 |
| −5.45 | 8.39 | 123.00 | 20.20 | 1.59 | 0.53 | 5.76 |
| −5.88 | 8.09 | 126.00 | 16.71 | 1.50 | 0.50 | 5.55 |
| −6.29 | 7.77 | 129.00 | 17.29 | 1.42 | 0.47 | 5.35 |
| −6.69 | 7.43 | 132.00 | 15.94 | 1.34 | 0.45 | 5.17 |
| −7.07 | 7.07 | 135.00 | 14.67 | 1.28 | 0.43 | 5.01 |
| −7.43 | 6.69 | 138.00 | 13.45 | 1.22 | 0.41 | 4.87 |
| −7.77 | 6.29 | 141.00 | 12.29 | 1.16 | 0.39 | 4.73 |
| −8.09 | 5.88 | 144.00 | 11.18 | 1.11 | 0.37 | 4.62 |
| −8.39 | 5.45 | 147.00 | 10.11 | 1.07 | 0.36 | 4.51 |
| −8.66 | 5.00 | 150.00 | 9.08 | 1.03 | 0.34 | 4.42 |
| −8.91 | 4.54 | 153.00 | 8.08 | 1.00 | 0.33 | 4.33 |
| −9.13 | 4.07 | 156.00 | 7.11 | 0.97 | 0.32 | 4.26 |
| −9.34 | 3.59 | 159.00 | 6.17 | 0.94 | 0.31 | 4.20 |
| −9.51 | 3.09 | 162.00 | 5.25 | 0.92 | 0.31 | 4.14 |
| −9.66 | 2.59 | 165.00 | 4.35 | 0.90 | 0.30 | 4.10 |
| −9.78 | 2.09 | 165.00 | 3.46 | 0.89 | 0.30 | 4.06 |
| −9.88 | 1.57 | 171.00 | 2.59 | 0.88 | 0.29 | 4.04 |
| −9.94 | 1.05 | 174.00 | 1.72 | 0.67 | 0.29 | 4.02 |
| −9.99 | 0.53 | 177.00 | 0.86 | 0.86 | 0.29 | 4.00 |
| −10.00 | 0.00 | 180.00 | 0.00 | 0.86 | 0.29 | 4.00 |

Cam 242 is designed in two stages. First, the ratio between the decrement delta phi in the angle phi divided by the corresponding increment delta $\theta$ in the angle $\theta$ is computed for each $\theta$. These ratios are then used to design a theoretical cam profile. If r represents the radius of pulley 254, for each angle $\theta$ (where $0 \leq \theta < 180°$) a line segment having a length of (delta phi/delta $\theta$)r is placed with one end at the origin, with the line segment extending from the origin at an angle of $\theta - 90°$. A smooth curve passing through the ends of these line segments (radii) defines one portion of the theoretical cam profile. The remaining portion of the theoretical cam profile ($180° \leq \theta < 360°$) is defined by requiring that the cam profile be symmetric with respect to the origin, since cable 242 is of fixed length and must wrap on one side of cam 242 as it unwraps from the other side.

Next, since cam 242 drives pulley 254 by means of a smooth stainless belt which wraps and unwraps on pulley 242, modifications to the above profile must be made to take into account this physical drive system. An iterative feed forward modification process is employed as described by the flow chart in FIG. 7A. Heuristically, the program starts with the selected angle $\theta_0$ and the corresponding theoretical cam radius $R_0$ and then checks for "interference" between the initial radius $R_0$ and subsequent theoretical radii $R_1, R_2, \ldots R_N$ corresponding to angles $\theta_0 +$ delta $\theta$, $\theta_0 + 2$ delta $\theta, \ldots$, $\theta_0 + N$ (delta $\theta$) for a selected positive integer N, and a selected delta $\theta$. "Interference" is defined by the inequalities appearing in the flow chart. Whenever an interference is found, the theoretical radius $R_0$ is reduced by 0.001 and the process repeated until the initial radius has been reduced so that it does not "interfere". This reduced value $R*_0$ is then the initial radius (for the angle $\theta_0$) of the actual cam. The entire process is then repeated for the next theoretical radius $R_1$, and so on. The reduced radii $R*_0, R*_1, \ldots$ define a corresponding portion of the actual cam profile by passing a smooth curve through the end points of these radii.

Figure 7A:
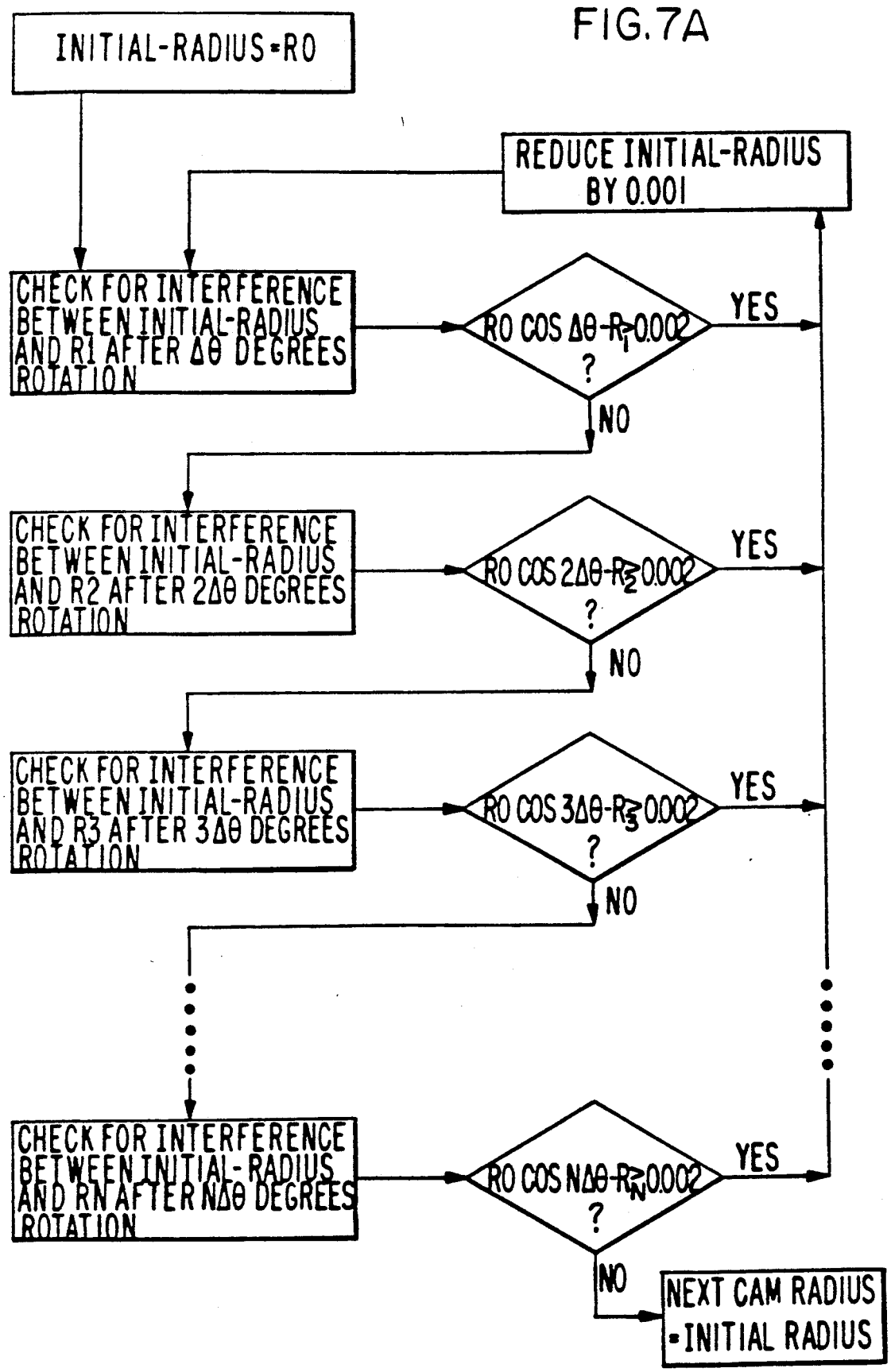
FIG. 7A shows a flow chart for deriving an actual cam profile from a theoretical cam profile.
Figure 7B:
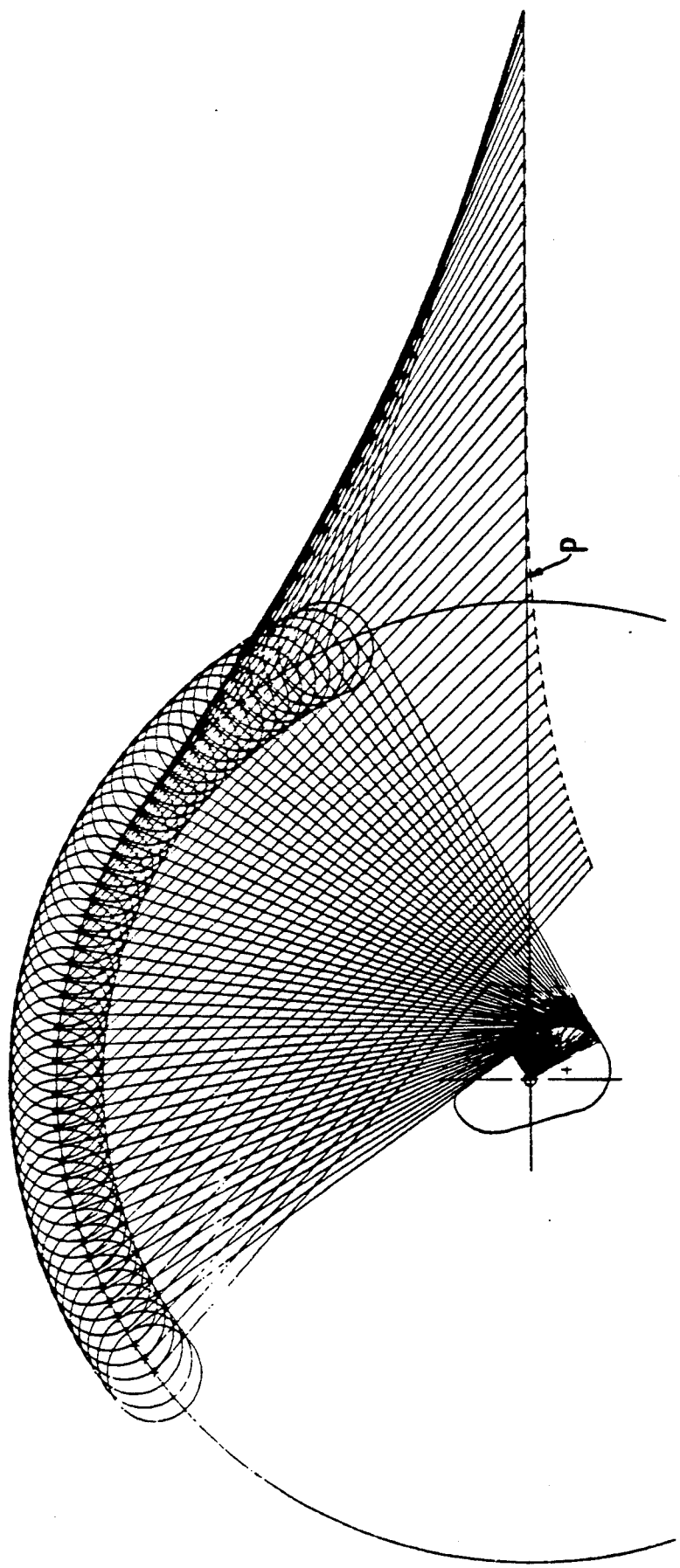
FIG. 7B shows one embodiment of an actual cam together with the path traced by the center of the wafer holder.

It should be observed that the constant 0.001 by which the radius is reduced and the maximum tolerance and 0.002 in the test inequalities in the flow chart of FIG. 7A may be replaced by other small constants depending on the degree of accuracy sought. FIG. 7B shows an actual cam profile and the motion of the point at the center of the wafer holder along the path P for the case where $r = 1$, $d = 10$, $f = 14$, using the above process to define the active portion of the cam profile 242 where $N = 7$ and delta $\theta = 3°$. In the above figure the active portion of the cam profile occurs for values of $\theta$ from 25° to 129°. An active portion of the cam profile is a portion of the profile from which the stainless steel belt 243 wraps and unwraps. The active cam is also defined by symmetry about the origin but the wrapping and unwrapping in the left half plane is not shown for the sake of clarity. The inactive portion of the cam may be defined in any manner which does not interfere with the active profile of the cam 242, as, for example, shown in FIG. 7B, which is drawn to scale. The fixed point 242f may be selected as any point in the inactive portion of the cam profile where the belt makes contact. The fixed point 254f is selected so that the induced rotation of pulley 254 does not cause the fixed point 254f on belt 243 to rotate off pulley 254. If desired, the belt may be extended from a first fixed point in the inactive region of the profile of cam 242, around pulley 254 and back to a second fixed point in the inactive region of the profile of cam 242.

In the embodiment described above pulley 254 is circular. However, a similar process for defining the profile of cam 242 to provide linear motion may also be employed with circular pulley 254 being replaced by a noncircular cam (pulley).

Figure 8:
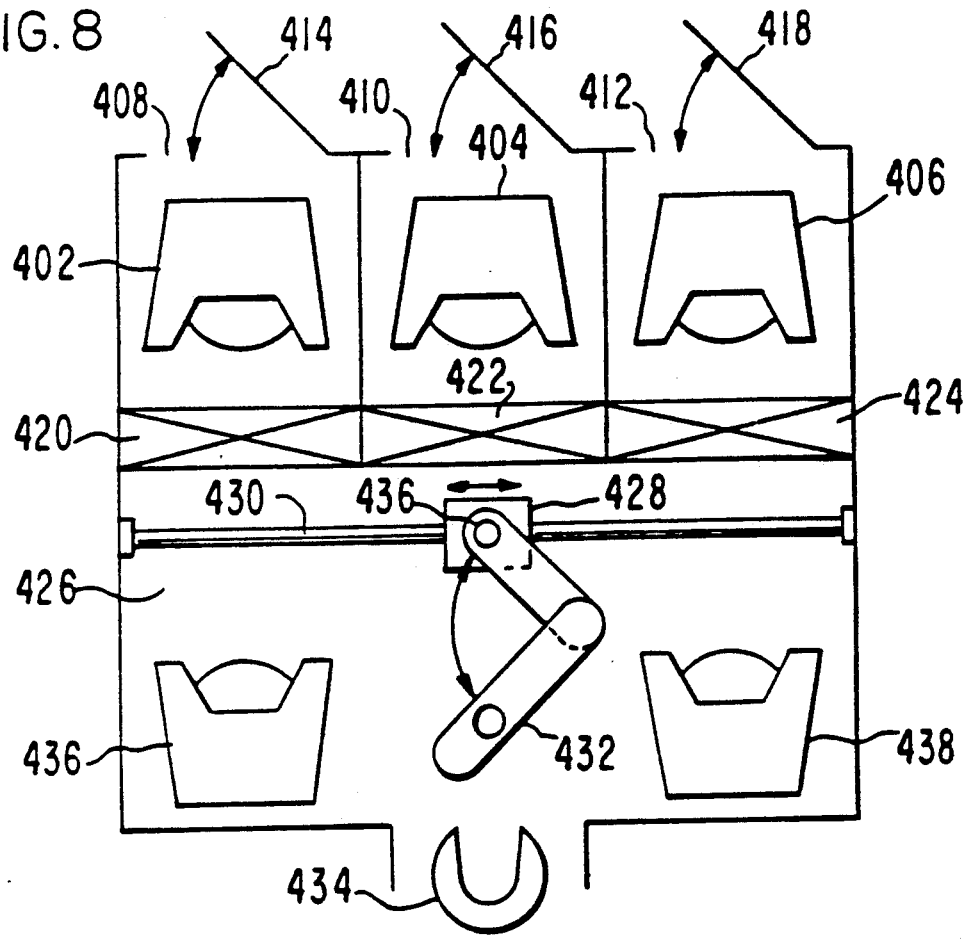
FIG. 8 shows a schematic plan view of a particularly preferred embodiment of the loadlock module according to the invention.

In another embodiment of the wafer handler and loadlock module 400 (FIG. 1) which is to be particularly preferred, three or more cassettes of wafers are loaded into the vacuum in separate loadlocks in order to facilitate high speed processing and wafer outgassing. As shown in FIG. 8, cassettes 402, 404 and 406 are shown in loadlock chambers 408, 410 and 412, respectively. The cassettes are loaded through doors 414, 416 and 418 from the clean roof. These loadlock chambers are pumped from below by suitable pumping means (not shown). When suitable levels of vacuum are achieved valves 420, 422 or 424 (shown only schematically) may be opened to permit movement of the wafers from the cassette into the wafer loadlock handling chamber 426. Within the chamber 426, a handling arm driving mechanism 428 is mounted on a track 430. The handling arm driving mechanism 428 may be moved along the track 430 to align with each of the loadlock chambers 408, 410, 412. A two-piece arm 432 is mounted above and driven by the handling arm driving mechanism 428. The arm 432 is used to reach through any one of the valves 420, 422, 424 to pick up a wafer from a cassette or to return a wafer to the cassette. Elevators (not shown) below the tables on which the cassettes rest are used to raise or lower the cassettes to permit the arm to reach different wafers in each cassette. The arm 432 can be used to move the wafer to a resting table 434 from which it is picked up by another wafer handling device of the system. Hot wafers picked up by the arm 432 can be moved to storage cassettes 436 or 438 to permit the wafer to cool before moving the wafer back to the cassette.

Figure 9:
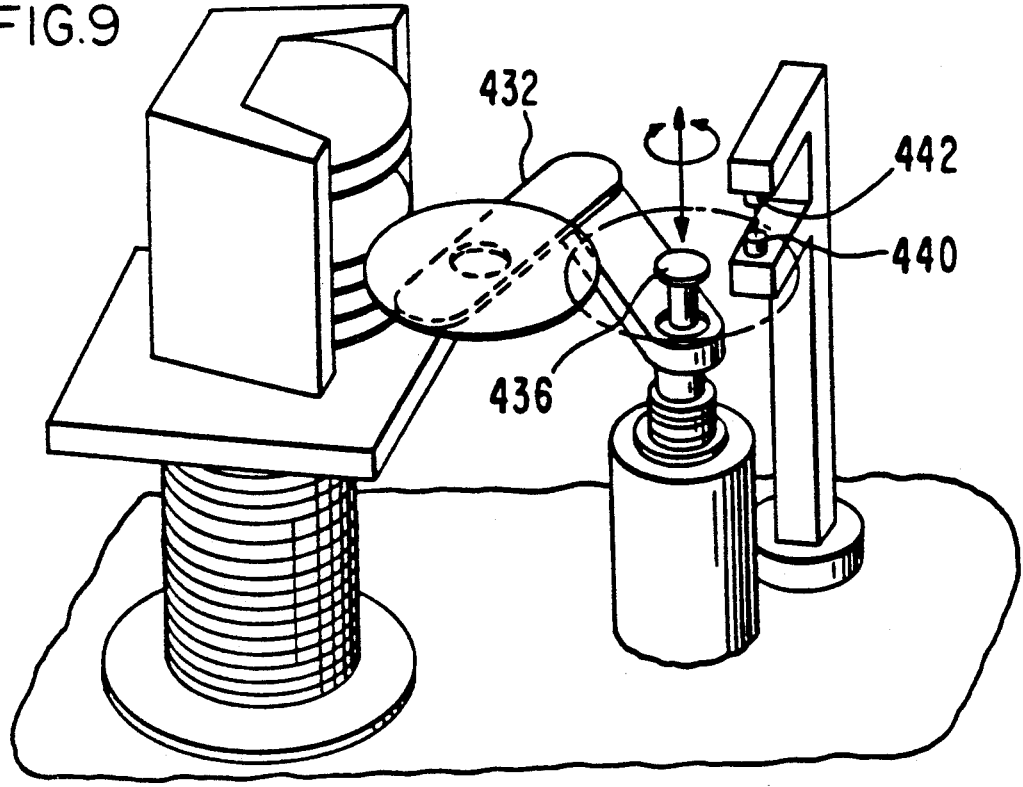
FIG. 9 shows a perspective view of the wafer handling arm and aligner of FIG. 8.

An important feature of the invention is the concentric wafer orientation device incorporated into the handling arm driving mechanism 428. A table 436 rests on a shaft (not shown) which is concentric with the shaft connecting the handling arm driving mechanism 428 to the handling arm 432. A view of this arrangement is shown in FIG. 9. A wafer is placed over the table 436 by the arm 432. The table 436 is rotated so that the wafer edge passes between light emitter 438 and light detector 44.0 Rotation of the edge of the wafer through the light beam provides light intensity variation information as a function of angle of rotation which permits the central computer to calculate the centroid of the wafer and the position of the flat. The computer then aligns the flat and stores the information on the true center for setting the wafer on the table 434. Further details of this embodiment of the loadlock module are given in the copending application of Richard J. Hertel et al U.S. Ser. No. 135,568 entitled "Wafer Transport System", filed Dec. 21, 1987, now U.S. Pat. No. 4,836,733 issued on June 6, 1989, the disclosures of which are hereby incorporated by reference.

The wafer pass through module 500 can also use the same rotational flat alignment described above in the flat aligner 501. The rotatable table 436 receives the wafer into the module 500. The light emitter 438 and light detector 440 are used to provide light intensity information as previously described to permit aligning the wafer.

Figure 10:
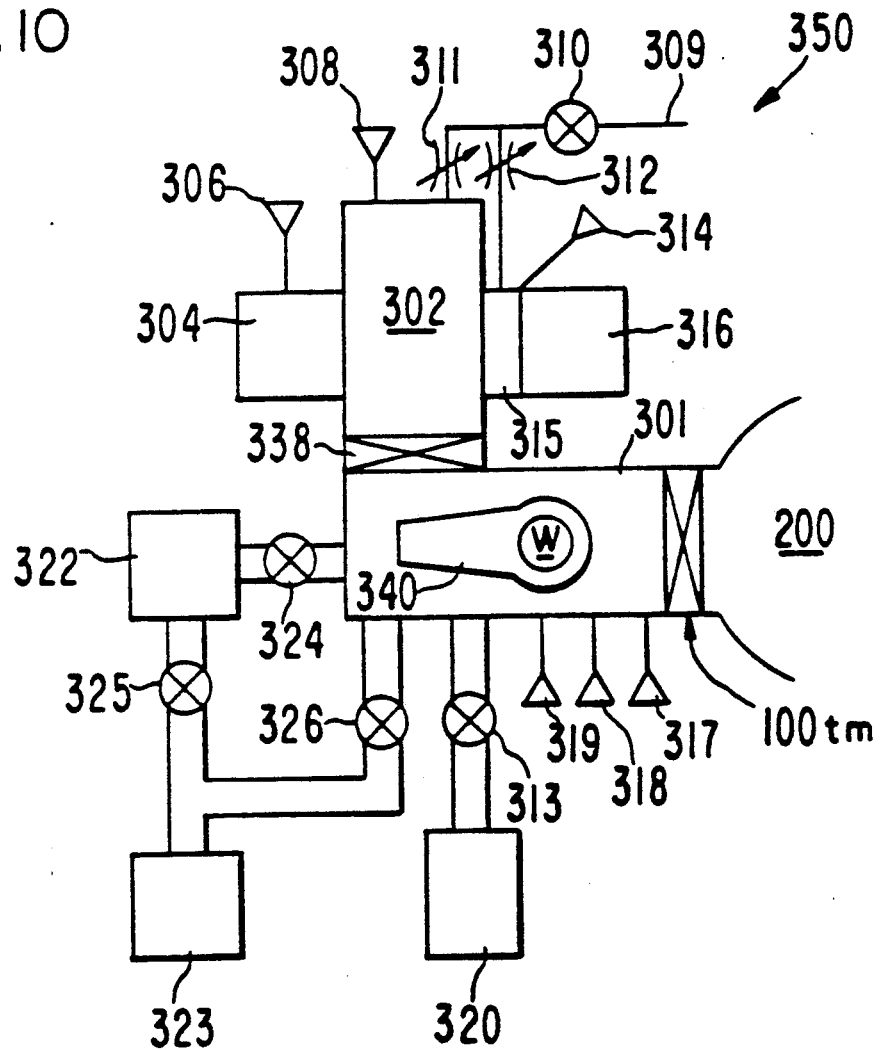
FIG. 10 shows a schematic diagram of an embodiment of a sputter module according to the invention.
Figure 11:
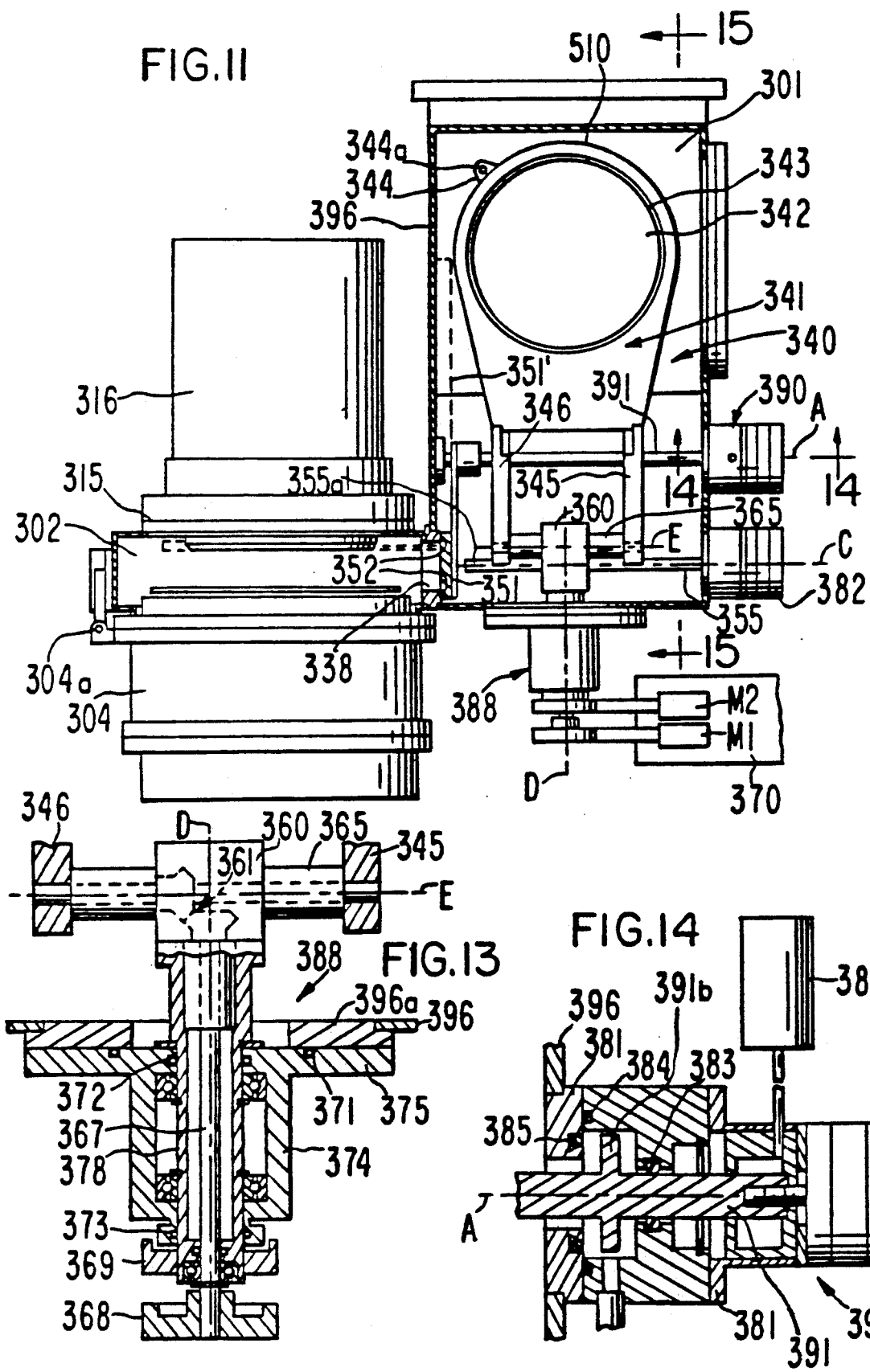
FIG. 11 is a top view in partial section of the sputter module according to the invention.

FIG. 10 shows a schematic diagram of one embodiment of sputter module 350. Sputter module 50 includes pre-process vacuum chamber 301, wafer handler arm 340, valve 338 which provides a vacuum seal between process chamber 301 and sputter chamber 02, sputter source 304, heater 315, and match box 16. In operation, a wafer is transferred from the wafer transport arm mechanism (not shown in FIG. 10; see FIGS. 6, 7) in transfer chamber 200 to gate valve module 100tm to wafer handler arm 340 which is shown in more detail in FIGS. 11-14 and FIG. 16. Gate valve module 100tm is the same as gate valve module 100 shown in FIGS. 4 and 5. When the transfer of the wafer from the transport arm mechanism in chamber 200 to wafer handler arm 340 is complete, valve 100tm is closed via a control mechanism (not shown). In this manner the atmosphere in process chamber 302 is isolated from the atmosphere in transfer chamber 200. Wafer handler arm 340 then rotates the horizontal wafer W clipped thereto through 95° within process chamber 301 so that the planar surfaces of wafer W make an angle of 5° with the vertical. This rotation is shown in perspective view in FIG. 12. Wafer handler arm 340 then rotates with wafer W clipped thereto through valve opening 338 into process chamber 302 and then rotates with wafer W through 5° so that the planar surfaces of the wafer are vertical and a portion of the back surface of wafer W rests on heater 315. Heater 315 is well known in the art and may be, for example, part no. 682530 made by Varian Associates, Inc. Match box 316 provides an impedance transfer between the RF heating source (not shown) and the heater glow discharge. With the wafer at a selected temperature, sputter source 304 is then activated via a control mechanism (not shown in FIG. 10). Gas line 309 provides argon gas at a selected pressure to valve 310. Needle valve 311 controls the flow of argon from valve 310 to sputter chamber 302. Needle valve 312 controls the flow of argon to the cavity formed between the back surface of wafer W and heater 315. Switch 308 is a pressure activated switch which acts as a back up safety switch to cut power to sputter source 304 and all other electrical apparatus associated with the sputter module when the pressure in chamber 302 rises above a selected level less than or equal to atmospheric pressure Interlock switch 306 is a safety switch which cuts power to source 304 when the access door (not shown) in FIG. 10 is opened. Similarly, interlock switch 314 is a safety switch which cuts power to heater 315 when cooling water flow fails. Gauges 318 and 319 measure pressure in chamber 301. Roughing gauge 318 measures pressures in the range between atmospheric pressure and $10^{-3}$ torr. Ion gauge 319 measures pressure less than approximately $10^{-3}$ torr. Interlock switch 317 is a safety switch which cuts power to prevent opening of valve 338 when chamber 301 is at atmospheric pressure.

A capacitance manometer gauge 320 is a pressure measuring device which senses pressure in chamber 301 and may be isolated from chamber 301 by valve 313. The pumping mechanism used to evacuate chamber 301 is well known and includes roughing pump 323 which reduces pressure in chambers 301 and 302 via valve 326 to a selected pressure, approximately $10^{-2}$ torr; high vacuum pump 322, for example a cryopump, then further evacuates chambers 301 and 302 via valve 324 when valve 326 is closed. Valve 324 is closed to protect pump 322 when chamber 301 is vented to atmosphere. Chambers 301 and 302 are protected by a trap (not shown) in the pumping system foreline. Valve 325 is used to evacuate pump 322 for starting the pump.

FIG. 16 shows a cross-sectional view of the mechanism by which a wafer is transferred from wafer transport arm mechanism 201 shown in FIGS. 6 and 7 to wafer arm 340 in sputter module preprocess chamber 1. A wafer is transported into chamber 301 by arm mechanism 201 (not shown in FIG. 16, but shown in FIG. 6) being extended through port P so that wafer W carried by wafer holder 280 of arm 201 is situated above a first table 500. Table 500 is rigidly mounted on shaft 501 which, driven by air cylinder 502, is linearly translatable vertically as indicated by double-headed arrow 518. Shaft 501 passes through flange 397 into vacuum chamber 301. Bellows 522 which is welded to flange 398 which is mounted to flange 397 of housing 396 and elastomeric O-ring 520 between bellows 522 and shaft 520 provide a vacuum seal between chamber 301 and the exterior atmosphere. Table 500 is dimensioned so that it may be elevated through the circular opening in wafer holder 280 (see FIG. 6) thus removing the wafer from wafer holder 280 which is then withdrawn from chamber 301 as explained in conjunction with FIGS. 6 and 7. At this point wafer W rests on table 500 as shown in FIG. 16. Note that the edge of wafer W extends beyond the perimeter of table 500 in the scalloped areas (not shown) of table 500 where clips will eventually engage the wafer's edge. Wafer arm mechanism 340 is rotated (as explained below) so that circular opening 342 (FIG. 11) in wafer holder plate 341 is centered above wafer W. A circular ceramic ring 511 is mounted beneath rim 510 of wafer plate 341. A plurality of flexible wafer clips are fixedly attached to ceramic ring 511 at approximately equal intervals. Two such clips, 512a and 512b, are shown in FIG. 16. A prong corresponding to each flexible wafer clip is rigidly attached to a second table 514. Prongs 514a and 514b corresponding to clips 512a and 512b are shown in FIG. 16. Table 514 is rigidly attached to shaft 503 which, driven by air cylinder 504, is linearly translatable in the vertical direction as indicated by double-headed arrow 516. Shaft 503 also passes through housing 396 of chamber 301. Bellows 523 mounted to flange 398 of housing 396 and elastomeric O-ring 521 between bellows 523 and shaft 503 provides a vacuum seal between the chamber 301 and the exterior atmosphere. When wafer W has been transferred to table 500, table 514 is then elevated so that each prong attached to table 514 engages its corresponding flexible wafer clip thereby opening the clip. Table 500 is then elevated so that wafer W is in line with the opened clips. Table 514 is then lowered causing the clips to close and engage the edge of wafer W. FIG. 16 shows clips 512a and 512b engaging the edge of wafer W in the phantom position W'. Table 500 is then also lowered. This completes the transfer of wafer W from arm 201 to arm 340.

Arm extensions 345 and 346 of wafer plate 341 (FIG. 11) are rigidly attached to shaft 365 which extends between arm extensions 345 and 346. This is shown in enlarged scale in FIG. 13. Shaft 365 passes through gear box 360. Gear box 360 includes a conventional right angle gear mechanism 361 for coupling the rotation of drive shaft 367 to shaft 365. Drive shaft 367 is rotated by turning pulley 368 rigidly attached thereto and driven by a suitable mechanism, e.g., a belt attached to first motor $M_1$ in housing 370. Motor $M_1$ drives shaft 367 which in turn, via right angle gear mechanism 361, causes wafer arm 340 on shaft 365 to rotate 95° from the horizontal (as shown in FIG. 12) along with wafer W clipped to ceramic ring 511 attached to rim 510 of wafer arm plate 341.

Shaft 367 is the inner shaft of a dual shaft coaxial feedthrough 388 (which may have ferrofluidic seals). Shaft 367 passes from vacuum chamber 301 through housing 396 to exterior pulley 368. Elastomeric O-ring 373 provides a vacuum seal between vacuum chamber 301 and the atmosphere exterior to chamber 301. Outer shaft 378 of ferrofluidic feedthrough 388, which is coaxial with inner shaft 367, also extends through housing 396 to pulley 369 which is rigidly attached thereto. Outer shaft 378 is rotated by rotating pulley 369 by a suitable means, e.g., a belt, attached to motor $M_2$ in housing 370. Elastomeric O-ring 372 between ferrofluidic housing 374 and outer shaft 378 provides vacuum seal between chamber 301 and the atmosphere exterior to chamber 301. Housing 374 is welded to flange 375. Flange 396a is bolted to flange 375. Flange 396a is welded to chamber wall 396. O-ring 371 provides a vacuum seal between chamber 301 (via flange 396a) and feedthrough 388.

Figure 12:
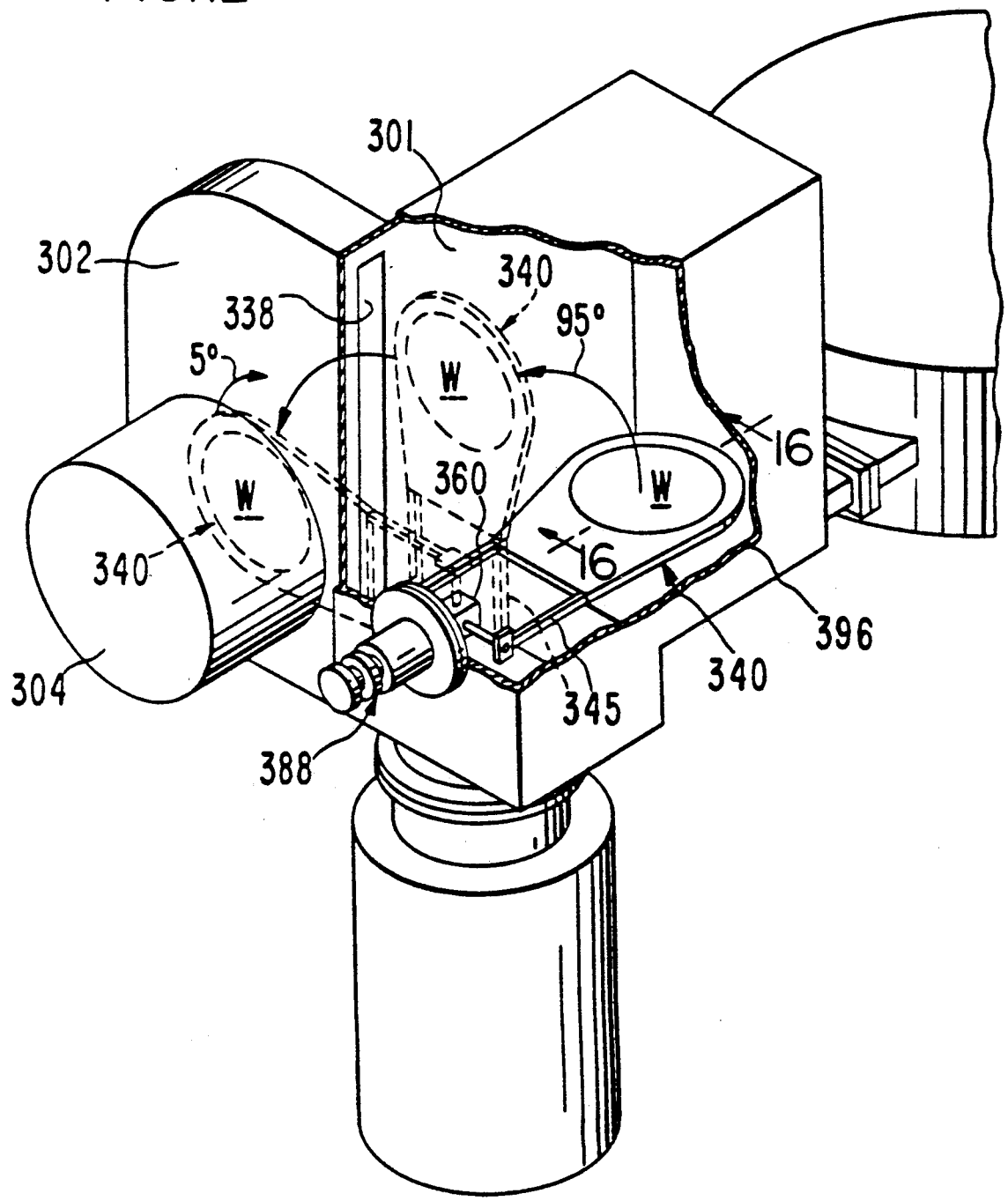
FIG. 12 is a perspective view in partial section of the module of FIG. 11.

When wafer arm 340 has been rotated through proximately 95° from the horizontal, as shown in FIG. 12, it is then rotated through rectangular opening 338 into sputter chamber 302. This rotation is accomplished by rotating outer shaft 378 by means of motor M₂. The end of shaft 378 interior to chamber 301 is rigidly attached to gear box housing 360. As shaft 378 is rotated in a counterclockwise direction, gear box 360, shaft 365 and wafer arm 340 all rotate in a counterclockwise direction as shown in FIG. 12. A rotation through an angle of approximately 90° places wafer W in front of heater 315. By again rotating inner shaft 367, wafer W attached to ceramic ring 511, which is attached to wafer arm plate 341, is rotated through an angle of approximately 5° so that its back surface comes in contact with heater 315. When wafer arm 340 is properly positioned with respect to heater 315, a pin (not shown) adjacent heater 315 engages the alignment aperture 344a in protusion 344 from wafer holder plate 341 shown in FIG. 11.

Wafer holder plate 341 may be one removable plate/shield or two stainless steel layers 341a and 341b as shown in cross section in FIG. 16. Top layer 341a is removably attached to bottom layer 341b by two screws (not shown). Top layer 341a shields bottom layer 341b from sputter deposition and helps reduce sputter deposition build up on the edge shield 530 surrounding ceramic ring 511. Layer 341a is replaced whenever sputter depositions on layer 341a builds up to undesirable levels. Sputter source 304 is well known in the art; for example, sputter source 304 may be Varian CONMAG ™ and is therefore not described further herein. Sputter source 304 pivots open on hinge 304a (FIG. 11) to allow access to source targets and shields.

When wafer handler arm 340 is in preprocess chamber 301, preprocess chamber 301 may be vacuum isolated from sputter chamber 302 by means of rectangular door 351. Rectangular door 351 is attached to shaft 391 by brace 353. Shaft 391 is rotated by actuator 380 through a crank arm so that door 351 is in front of and slightly displaced from rectangular opening 338 to sputter chamber 302. As shown in FIG. 15, door 351 is dimensioned to be larger than opening 338. Door 351 is slideable with shaft 391 and is linearly translated so that O-ring 352 sealingly engages the chamber housing surrounding opening 338. To this end, shaft 341 is translated along axis A so that it translates door 351 along axis A toward opening 338. The mechanism 390 for driving shaft 391 contained in housing 381 is shown in more detail in FIG. 14. Shaft 391 is translated in either direction along axis A by a conventional air-driven piston attached to shaft 391. When shaft 391 is only partially extended toward opening 338, O-ring 383 provides a dynamic vacuum seal between chamber 301 and atmosphere. However, when shaft 391 is fully extended, when door 351 is rotated away from its sealing position and is in its rest position as shown as in FIG. 15, annular extension 391 b of shaft 391 engages elastomeric O-ring 385 so that a static vacuum seal is formed between housing 381 and annular extension 391b. This novel static seal provides more reliable vacuum isolation between chamber 301 and atmosphere. A second shaft 355 is translated along axis C by a conventional air-driven piston 382 to assist in pressing door 351 against the chamber housing to seal opening 338.

Although the modular wafer transport and processing system of the present invention has been described primarily with respect to its application to semiconductor wafer or substrate processing, it should be understood that the inventive system is equally useful in the processing of many other wafer or disc-like workpieces. Neither is it required that other such workpieces have flats on their edges; workpieces which are fully circular in outline can be handled as well. More specifically, the inventive system is especially useful for processing any magnetic or optical storage medium in a wafer-like or disc-like form.

This invention is not limited to the preferred embodiment and alternatives heretofore described, to which variations and improvements may be made including mechanically and electrically equivalent modifications to component parts, without departing from the scope of protection of the present patent and true spirit of the invention, the characteristics of which are summarized in the following claims.

What is claimed is:

1. A wafer handler arm mechanism comprising:
   a vacuum housing;
   a second shaft surrounding said first shaft and coaxial therewith;
   a first rigid arm inside said vacuum housing, having a first end and a second end;
   a third shaft inside said vacuum housing;
   a second rigid arm inside said vacuum housing, rotatably secured to the second end of said first rigid arm by means of said third shaft;
   a bearing mounted to said first rigid arm and said third shaft to permit relative rotation therebetween;
   means for rotating said first shaft relative to said second shaft;
   means for causing rotation of said second rigid arm relative to said first rigid arm including a cam being mounted at the first end of said first rigid arm, said cam having an axis which coincides with the axis of said first and said second shafts, and a pulley, said pulley fixedly mounted at the second end of said first rigid arm to said third shaft and means for rotatably coupling said cam to said pulley.

2. The wafer handler arm of claim 1 wherein the said first rigid arm is fixedly attached at the first end to the said first shaft.

3. The wafer handler arm of claim 1 wherein said means for rotatably coupling said cam to said pulley is a belt, said belt connecting said cam to said pulley so that rotation of said first shaft in a first direction will cause said second rigid arm to rotate in an opposite direction.

4. The wafer handler arm of claim 1, wherein the means for rotating said first shaft and said means for rotating said second shaft includes a first motor and a second motor respectively.

5. The wafer handler arm of claim 1 wherein said second rigid arm is adopted to support a single silicon wafer.

* * * * *